(12) United States Patent  (10) Patent No.: US 7,849,660 B2
Metzger  (45) Date of Patent: *Dec. 14, 2010

(54) ICE BAGGING SYSTEM AND METHOD

(75) Inventor: Mark C. Metzger, Glendale, AZ (US)

(73) Assignee: Reddy Ice Corporation, Dallas, TX (US)

( * ) Notice: Subject to any disclaimer, the term of this patent is extended or adjusted under 35 U.S.C. 154(b) by 621 days.

This patent is subject to a terminal disclaimer.

(21) Appl. No.: 11/837,320

(22) Filed: Aug. 10, 2007

(65) Prior Publication Data

US 2008/0022635 A1    Jan. 31, 2008

Related U.S. Application Data

(60) Provisional application No. 60/837,374, filed on Aug. 11, 2006.

(51) Int. Cl.
B65B 57/00 (2006.01)
B65B 5/10 (2006.01)

(52) U.S. Cl. .............................. 53/58; 53/257; 53/260; 53/284.7

(58) Field of Classification Search .................... 53/247, 53/248, 257, 258, 260, 284.7, 58, 503, 459, 53/469, 384.1, 385.1; 62/340, 344
See application file for complete search history.

(56) References Cited

U.S. PATENT DOCUMENTS

| | | |
|---|---|---|
| 2,116,300 A | 5/1938 | Campos |
| 2,584,726 A | 2/1952 | McOmber |
| 3,498,020 A | 3/1970 | Eppenberger |
| 3,559,424 A | 2/1971 | Nelson |
| 3,610,482 A | 10/1971 | Van Steenburgh, Jr. |
| 3,712,019 A | 1/1973 | Lamka et al. |
| 3,719,307 A | 3/1973 | Larson |
| 3,789,570 A | 2/1974 | Mullins, Jr. |
| 3,807,193 A | 4/1974 | McKenney et al. |
| 3,822,866 A | 7/1974 | Daester |
| 3,897,676 A | 8/1975 | Membrino |
| 3,913,343 A | 10/1975 | Rowland et al. |
| 3,918,266 A | 11/1975 | Gindy et al. |
| 3,969,909 A | 7/1976 | Barto et al. |
| 3,974,625 A | 8/1976 | Simmons |
| 3,977,851 A | 8/1976 | Toya |
| 3,982,377 A | 9/1976 | Vanderpool |
| 4,013,199 A | 3/1977 | Brown |
| 4,074,507 A | 2/1978 | Ruf |
| 4,132,049 A | 1/1979 | Mullins, Jr. |
| 4,139,029 A | 2/1979 | Geraci |

(Continued)

FOREIGN PATENT DOCUMENTS

GB    1459629    12/1976

(Continued)

OTHER PUBLICATIONS

Office Action issued on Mar. 26, 2007, U.S. Patent Office, in U.S. Appl. No. 11/371,300.

(Continued)

*Primary Examiner*—Louis K Huynh
(74) *Attorney, Agent, or Firm*—Haynes & Boone, LLP

(57) ABSTRACT

An ice bagging system is described.

18 Claims, 15 Drawing Sheets

U.S. PATENT DOCUMENTS

| | | | |
|---|---|---|---|
| 4,139,126 A | 2/1979 | Krasner |
| 4,189,063 A | 2/1980 | Matthiesen |
| 4,348,872 A | 9/1982 | Hill |
| 4,350,004 A | 9/1982 | Tsujimoto et al. |
| 4,368,608 A | 1/1983 | Ray |
| 4,404,817 A | 9/1983 | Cox, III |
| 4,409,763 A | 10/1983 | Rydeen |
| 4,420,197 A | 12/1983 | Dreiling |
| 4,461,520 A | 7/1984 | Alneng |
| 4,612,779 A | 9/1986 | Hatton |
| 4,689,937 A | 9/1987 | Finan, Sr. et al. |
| 4,903,494 A | 2/1990 | Wigley |
| 4,909,696 A | 3/1990 | Wigley |
| 4,942,983 A | 7/1990 | Bradbury |
| 5,027,610 A | 7/1991 | Hara |
| 5,079,897 A | 1/1992 | Muller |
| 5,088,300 A | 2/1992 | Wess |
| 5,108,590 A | 4/1992 | DiSanto |
| 5,109,651 A | 5/1992 | Stuart |
| 5,112,477 A | 5/1992 | Hamlin |
| 5,211,030 A | 5/1993 | Jameson |
| 5,277,016 A | 1/1994 | Williams et al. |
| RE34,533 E | 2/1994 | Wigley |
| 5,440,863 A | 8/1995 | Toya et al. |
| 5,442,898 A | 8/1995 | Gabree et al. |
| 5,458,851 A | 10/1995 | Schroeder et al. |
| 5,473,865 A | 12/1995 | Tanaka et al. |
| 5,484,209 A | 1/1996 | Weng |
| 5,489,769 A | 2/1996 | Kubo |
| D372,036 S | 7/1996 | Timura et al. |
| 5,555,743 A | 9/1996 | Hatanaka |
| 5,577,821 A | 11/1996 | Chu |
| 5,581,982 A | 12/1996 | Schroeder et al. |
| 5,630,310 A | 5/1997 | Chadwell |
| D379,880 S | 6/1997 | Stoeckli et al. |
| 5,660,506 A | 8/1997 | Berge et al. |
| 5,708,223 A | 1/1998 | Wyss |
| 5,722,750 A | 3/1998 | Chu |
| 5,761,888 A | 6/1998 | Haley |
| 5,813,196 A | 9/1998 | Page et al. |
| 5,822,955 A | 10/1998 | Woosley et al. |
| D407,092 S | 3/1999 | Weaver |
| 5,887,442 A | 3/1999 | Howard et al. |
| 5,887,758 A | 3/1999 | Hawkes et al. |
| 6,044,658 A | 4/2000 | Ryu |
| 6,067,658 A | 5/2000 | Cho |
| 6,067,806 A | 5/2000 | Park |
| 6,082,350 A | 7/2000 | Crews et al. |
| 6,093,312 A | 7/2000 | Boulter |
| 6,112,539 A | 9/2000 | Colberg |
| 6,112,548 A | 9/2000 | Moenickheim |
| 6,112,558 A | 9/2000 | Wang |
| 6,119,441 A | 9/2000 | Lipes et al. |
| 6,134,907 A | 10/2000 | Mueller et al. |
| 6,238,031 B1 | 5/2001 | Weng |
| 6,266,945 B1 | 7/2001 | Schroeder |
| 6,276,517 B1 | 8/2001 | Peterson et al. |
| 6,279,329 B1 | 8/2001 | Berge et al. |
| 6,338,002 B1 | 1/2002 | Kuo |
| 6,354,338 B1 | 3/2002 | Takemoto |
| 6,377,863 B1 | 4/2002 | Koontz et al. |
| 6,394,309 B1 | 5/2002 | Fainberg |
| 6,405,553 B1 | 6/2002 | Willett |
| 6,427,456 B2 | 8/2002 | Niwa et al. |
| 6,474,048 B1 | 11/2002 | Metzger et al. |
| 6,474,049 B1 | 11/2002 | Lipes et al. |
| 6,497,083 B1 * | 12/2002 | Garwood et al. ............... 53/247 |
| 6,502,416 B2 | 1/2003 | Kawasumi et al. |
| 6,506,428 B1 | 1/2003 | Berge et al. |
| 6,596,233 B2 | 7/2003 | Berge et al. |
| 6,606,602 B1 | 8/2003 | Kolls |
| 6,684,647 B2 | 2/2004 | Petrenko |
| 6,685,053 B2 | 2/2004 | Hawkes et al. |
| 6,705,107 B2 | 3/2004 | Schlosser et al. |
| 6,761,010 B1 * | 7/2004 | Gibson ........................ 53/247 |
| 6,827,529 B1 | 12/2004 | Berge et al. |
| 6,850,996 B2 | 2/2005 | Wagner |
| 6,860,111 B2 | 3/2005 | Sanuki et al. |
| 6,862,866 B2 | 3/2005 | Jacobsen et al. |
| 6,904,946 B2 | 6/2005 | James |
| 6,932,124 B2 | 8/2005 | Dalton et al. |
| 6,938,428 B2 | 9/2005 | Onishi et al. |
| 6,953,132 B2 | 10/2005 | McCann et al. |
| 7,003,974 B1 | 2/2006 | Brooks |
| 7,013,657 B2 | 3/2006 | Hwang et al. |
| 7,032,401 B2 | 4/2006 | Dresser |
| 7,062,892 B2 | 6/2006 | Metzger |
| 7,096,686 B2 | 8/2006 | Brunner et al. |
| 7,104,291 B2 | 9/2006 | Dalton et al. |
| 7,137,271 B2 | 11/2006 | Hawkes et al. |
| 7,207,156 B2 | 4/2007 | Metzger |
| 7,310,957 B2 | 12/2007 | Broadbent et al. |
| 7,344,210 B2 | 3/2008 | Dresser |
| 7,421,834 B1 | 9/2008 | Doolan |
| 7,426,812 B2 * | 9/2008 | Metzger ........................ 53/58 |
| 7,426,945 B2 | 9/2008 | Dalton et al. |
| 7,497,062 B2 * | 3/2009 | Metzger ..................... 53/260 |
| 2003/0150230 A1 | 8/2003 | Waddle et al. |
| 2004/0084106 A1 | 5/2004 | James |
| 2004/0216481 A1 | 11/2004 | James et al. |
| 2006/0005553 A1 | 1/2006 | Metzger |
| 2006/0005564 A1 | 1/2006 | Metzger |
| 2007/0175235 A1 | 8/2007 | Metzger |
| 2007/0209330 A1 | 9/2007 | Metzger |
| 2007/0240441 A1 | 10/2007 | Hobson et al. |
| 2007/0267086 A1 | 11/2007 | Dunn |
| 2007/0267093 A1 | 11/2007 | Soderman |
| 2008/0196788 A1 | 8/2008 | Dalton et al. |
| 2008/0245438 A1 | 10/2008 | Ladson |
| 2008/0245439 A1 | 10/2008 | Ladson |
| 2008/0283145 A1 | 11/2008 | Maxwell |

FOREIGN PATENT DOCUMENTS

| | | |
|---|---|---|
| JP | Y H1-33455 | 10/1989 |
| JP | U H2-41067 | 3/1990 |
| JP | 2006-105559 | 4/2006 |
| WO | WO 2004042294 | 5/2005 |

OTHER PUBLICATIONS

Information Disclosure Statement filed Mar. 13, 2007 by Applicant, Mark Metzger, in U.S. Appl. No. 11/371,300.

Office Action issued on Feb. 12, 2007, U.S. Patent Office, in U.S. Appl. No. 11/371,300.

Final Office Action issued on Jul. 18, 2007, U.S. Patent Office, in U.S. Appl. No. 10/701,984.

Decision on Petition issued Apr. 20, 2007 by Derek L. Woods, Attorney, Office of Petitions, U.S. Patent Office, in U.S. Appl. No. 10/701,984.

Decision on Petition issued Nov. 8, 2006 by by Derek L. Woods, Attorney, Office of Petitions, U.S. Patent Office, in U.S. Appl. No. 10/701,984.

Notice of Abandonment issued Mar. 7, 2005, U.S. Patent Office, in U.S. Appl. No. 10/701,984.

Office Action issued Jul. 12, 2004, U.S. Patent Office, in U.S. Appl. No. 10/701,984.

U.S. Appl. No. 60/837,374, filed Aug. 11, 2006, Metzger.

U.S. Appl. No. 60/941,191, filed May 31, 2007, Metzger.

Hoshizaki Brochure (No Date) (12 pages).

Office Action mailed Apr. 15, 2010 regarding U.S. Appl. No. 11/837,320 (13 pages).

Order Granting Request for Ex Parte Reexamination of U.S. Patent No. 5,109,651 to Stuart, mailed Sep. 4, 2009, U.S. Appl. No. 90/010,643 (11 pages).

Office Action mailed Feb. 26, 2010 regarding Control No. 90/010,643 (17 pages).

Office Action mailed Apr. 2, 2010 regarding Control No. 90/010,643 (29 pages).

Order Granting Request for Ex Parte Reexamination of U.S. Patent No. 5,109,651 to Stuart, mailed Mar. 31, 2010, Control No. 90/010,920 (9 pages).

Decision Merging Reexamination Proceedings mailed Apr. 19, 2010 regarding Control Nos. 90/010,643 and 90/010,920 (3 pages).

Notice of Intent to Issue Ex Parte Reexamination mailed Apr. 20, 2010 regarding Control Nos. 90/010,643 and 90/010,920 (10 pages).

Office Action mailed Jan. 29, 2010 regarding U.S. Appl. No. 12/356,410 (6 pages).

Notice of Allowance mailed Jun. 1, 2010 regarding U.S. Appl. No. 12/356,410 (6 pages).

* cited by examiner

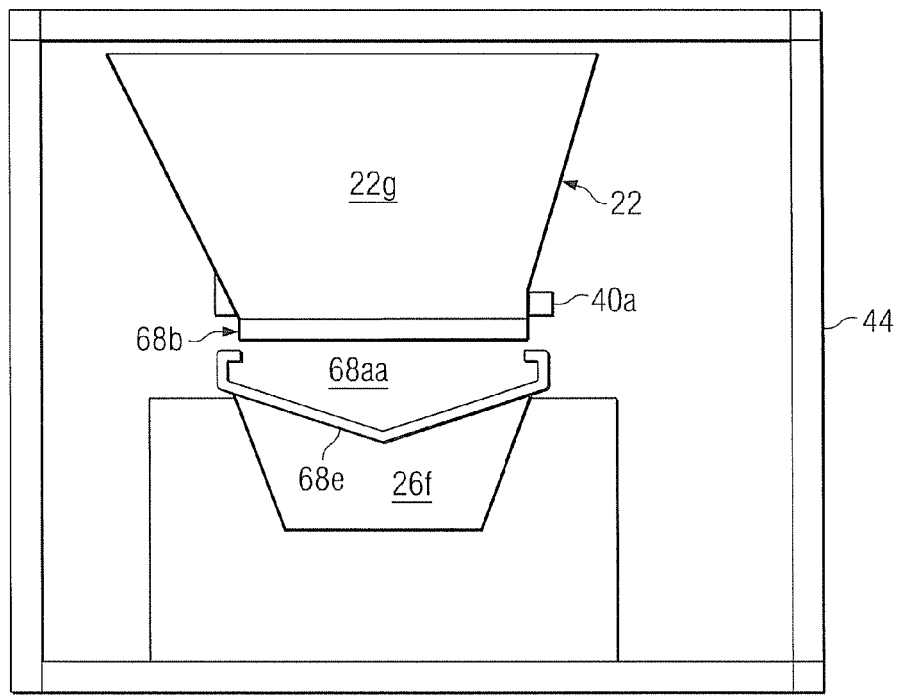
Fig. 19
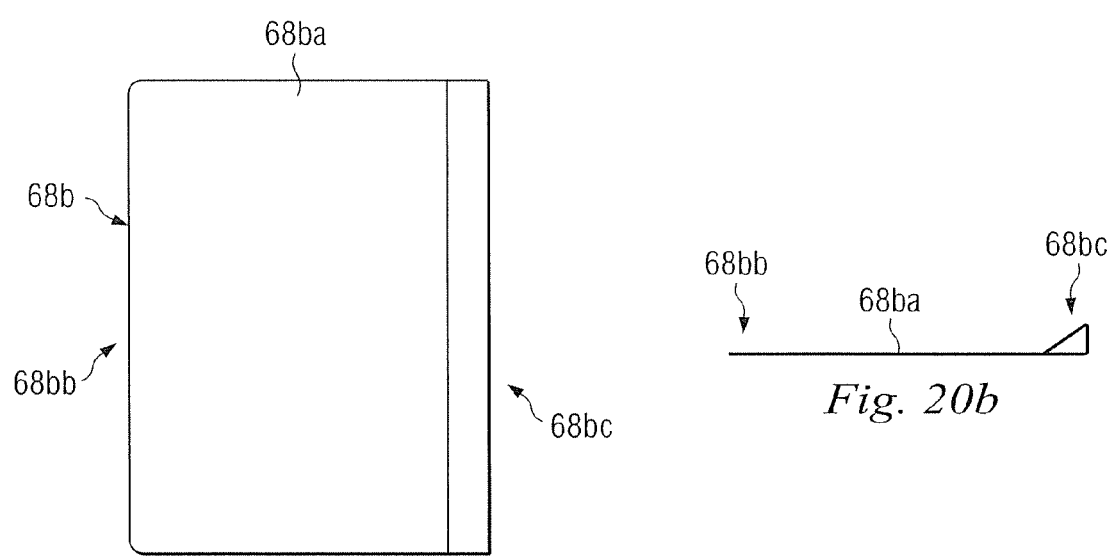
Fig. 20a
Fig. 20b

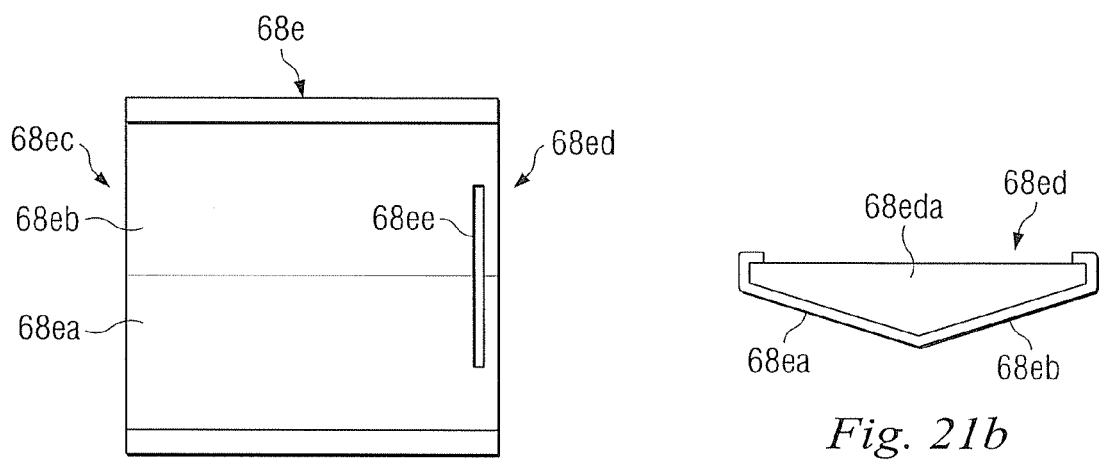
Fig. 21a
Fig. 21b
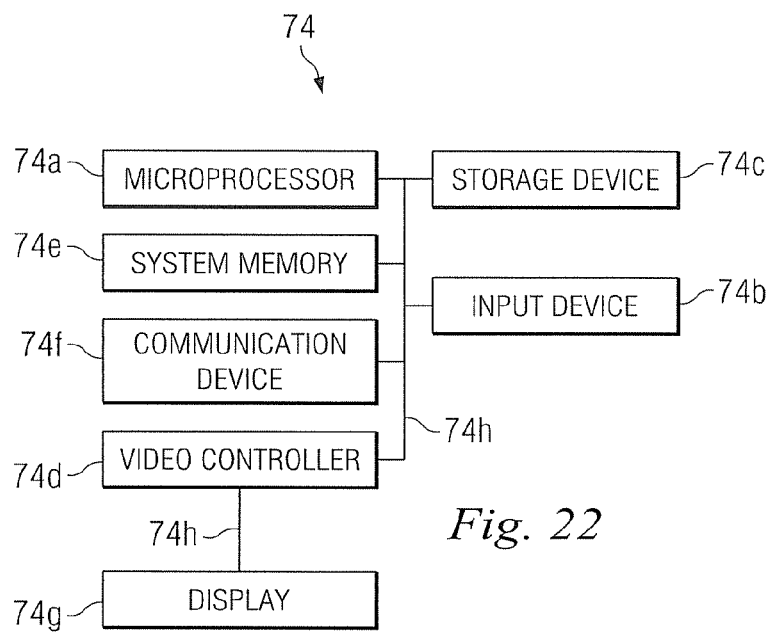
Fig. 22

ICE BAGGING SYSTEM AND METHOD

CROSS REFERENCE TO RELATED APPLICATIONS

This application claims the benefit of the filing date of U.S. application No. 60/837,374, filed on Aug. 11, 2006, the disclosure of which is incorporated herein by reference.

This application is related to (1) U.S. patent application Ser. No. 10/701,984, filed on Nov. 6, 2003; (2) U.S. patent application No. 60/647,221, filed on Jan. 26, 2005; (3) U.S. patent application No. 60/659,600, filed on Mar. 7, 2005; (4) U.S. patent application Ser. No. 11/371,300, filed on Mar. 9, 2006; (5) U.S. patent application No. 60/837,374, filed on Aug. 11, 2006; and (6) U.S. patent application No. 60/941,191, filed on May 31, 2007, the disclosures of which are incorporated herein by reference.

BACKGROUND

The present disclosure relates in general to ice and in particular to a system and method for bagging ice.

BRIEF DESCRIPTION OF THE DRAWINGS

FIG. 19 is another sectional view of the apparatus of FIG. 18 taken along line 19-19.

FIG. 20a is a top view of the top door of FIG. 18 according to an exemplary embodiment.

FIG. 20b is an elevational view of the top door of FIGS. 18 and 20a.

FIG. 21a is a top view of the bottom door of FIG. 18 according to an exemplary embodiment.

FIG. 21b is an elevational view of the bottom door of FIGS. 18 and 21a.

FIG. 22 is a diagrammatic illustration of a node for implementing one or more exemplary embodiments of the present disclosure.

DETAILED DESCRIPTION

Figure 1:
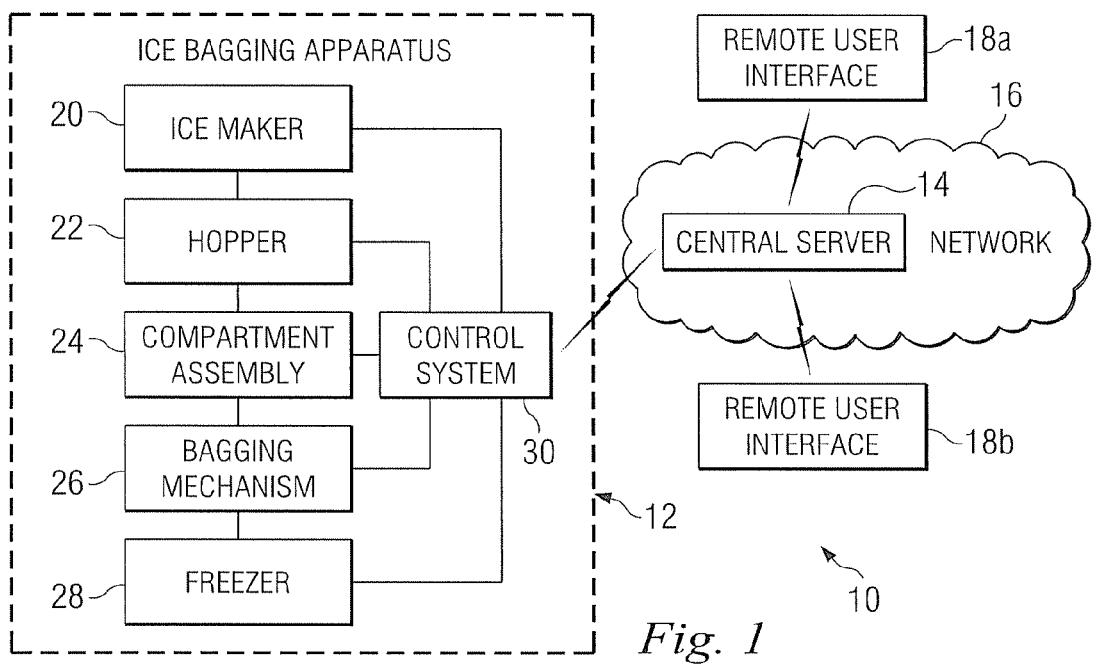
FIG. 1 is a diagrammatic illustration of a system according to an exemplary embodiment, the system including an apparatus, a central sever and a plurality of remote user interfaces, the apparatus including a control system, a compartment assembly and a hopper.

In an exemplary embodiment, as illustrated in FIG. 1, a system for bagging ice is generally referred to by the reference numeral 10 and includes an ice bagging apparatus 12 operably coupled to a central server 14 via a network 16. Remote user interfaces 18a and 18b are operably coupled to, and are adapted to be in two-way communication with, the central server 14 via the network 16. In several exemplary embodiments, the network 16 includes the Internet, any type of local area network, any type of wide area network, any type of wireless network and/or any combination thereof. In several exemplary embodiments, each of the remote user interfaces 18a and 18b includes a personal computer, a personal digital assistant, a cellular telephone, other types of computing devices and/or any combination thereof. In several exemplary embodiments, the central server 14 includes a processor and a computer readable medium or memory operably coupled thereto for storing instructions accessible to, and executable by, the processor. In several exemplary embodiments, the apparatus 12 is an ice merchandiser.

In an exemplary embodiment, with continuing reference to FIG. 1, the apparatus 12 includes an ice maker 20 and a hopper 22 operably coupled thereto. A compartment assembly 24 is operably coupled to the hopper 22, and a bagging mechanism 26 is operably coupled to the compartment assembly 24. A storage unit such as, for example, a freezer 28, is operably coupled to the bagging mechanism 26. A control system 30 is operably coupled to the ice maker 20, the hopper 22, the compartment assembly 24, the bagging mechanism 26 and the freezer 28.

Figure 2:
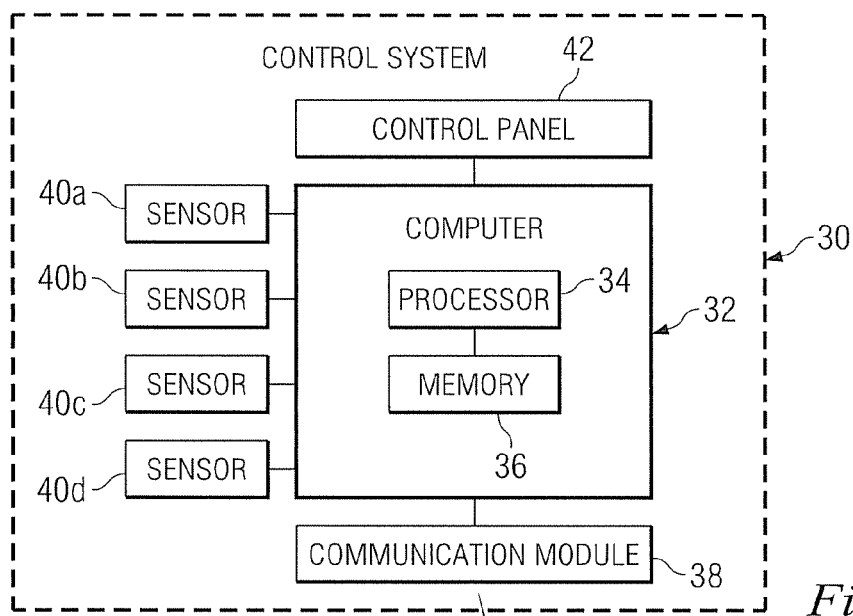
FIG. 2 is a diagrammatic illustration of the control system of FIG. 1 according to an exemplary embodiment.

In an exemplary embodiment, as illustrated in FIG. 2 with continuing reference to FIG. 1, the control system 30 includes a computer 32 including a processor 34 and a computer readable medium or memory 36 operably coupled thereto. In an exemplary embodiment, instructions accessible to, and executable by, the processor 34 are stored in the memory 36. In an exemplary embodiment, the memory 36 includes one or more databases and/or one or more data structures stored therein. A communication module 38 is operably coupled to the computer 32, and is adapted to be in two-way communication with the central server 14 via the network 16. Sensors 40a, 40b, 40c and 40d are operably coupled to the computer 32. A control panel 42 is operably coupled to the computer 32.

In several exemplary embodiments, the computer 32 includes a data acquisition unit that is adapted to convert, condition and/or process signals transmitted by the sensors 40a, 40b, 40c and 40d. In several exemplary embodiments, the control panel 42 includes one or more input devices such as, for example, one or more keypads, one or more voice-recognition systems, one or more touch-screen displays and/or any combination thereof. In several exemplary embodiments, the control panel 42 includes one or more output devices such as, for example, one or more displays such as, for example, one or more digital displays, one or more liquid crystal displays and/or any combination thereof, one or more printers and/or any combination thereof. In several exemplary embodiments, the control panel 42 includes one or more card readers, one or more graphical-user interfaces and/or other types of user interfaces, one or more digital ports, one or more analog ports, one or more signal ports, one or more alarms, and/or any combination thereof. In several exemplary embodiments, the computer 32 and/or the processor 34 includes, for example, one or more of the following: a conventional programmable general purpose controller, an application specific integrated circuit (ASIC), other conventional controller devices and/or any combination thereof.

Figure 3:
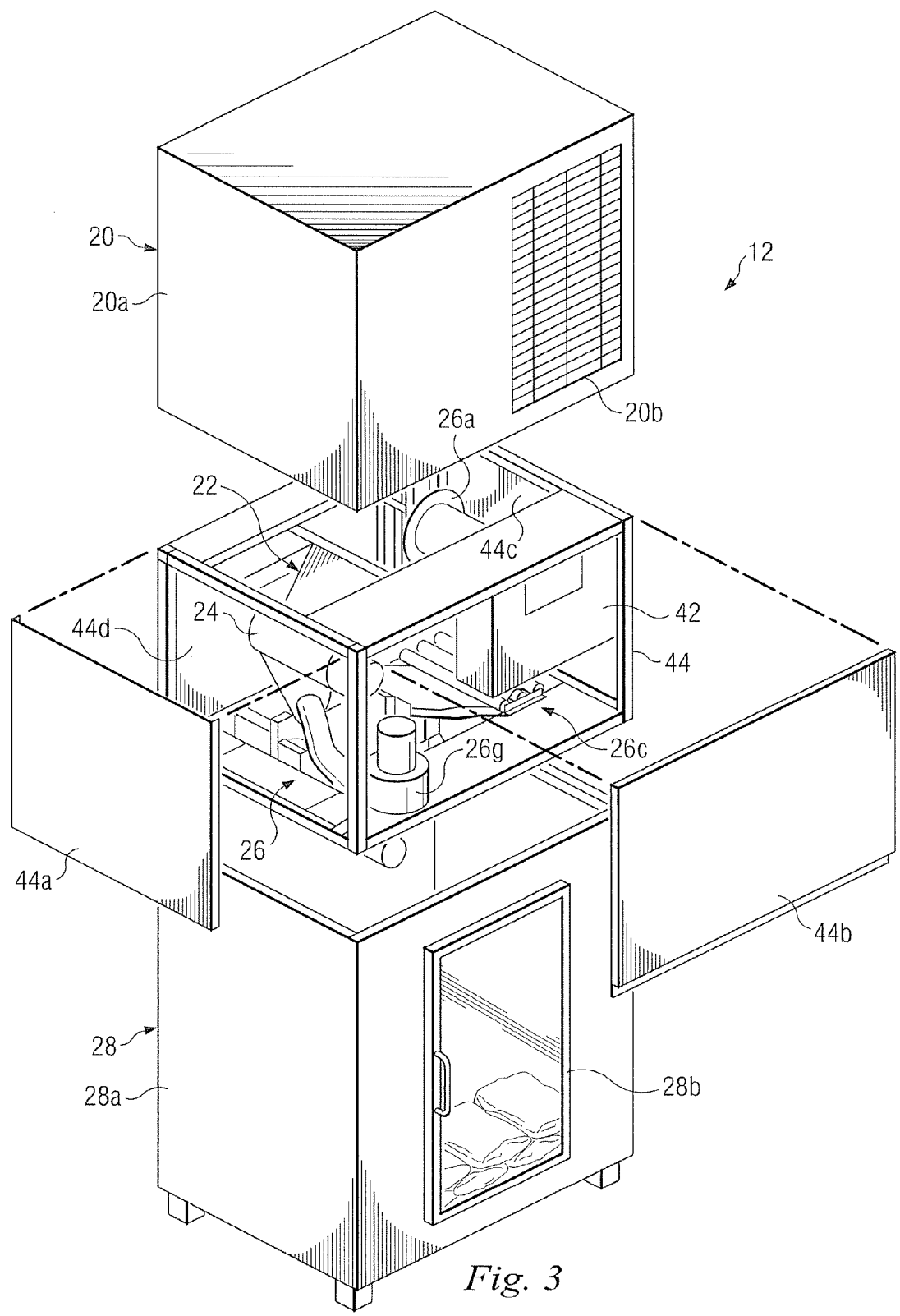
FIG. 3 is a partially exploded view of the apparatus of FIG. 1 according to an exemplary embodiment.
Figure 4:
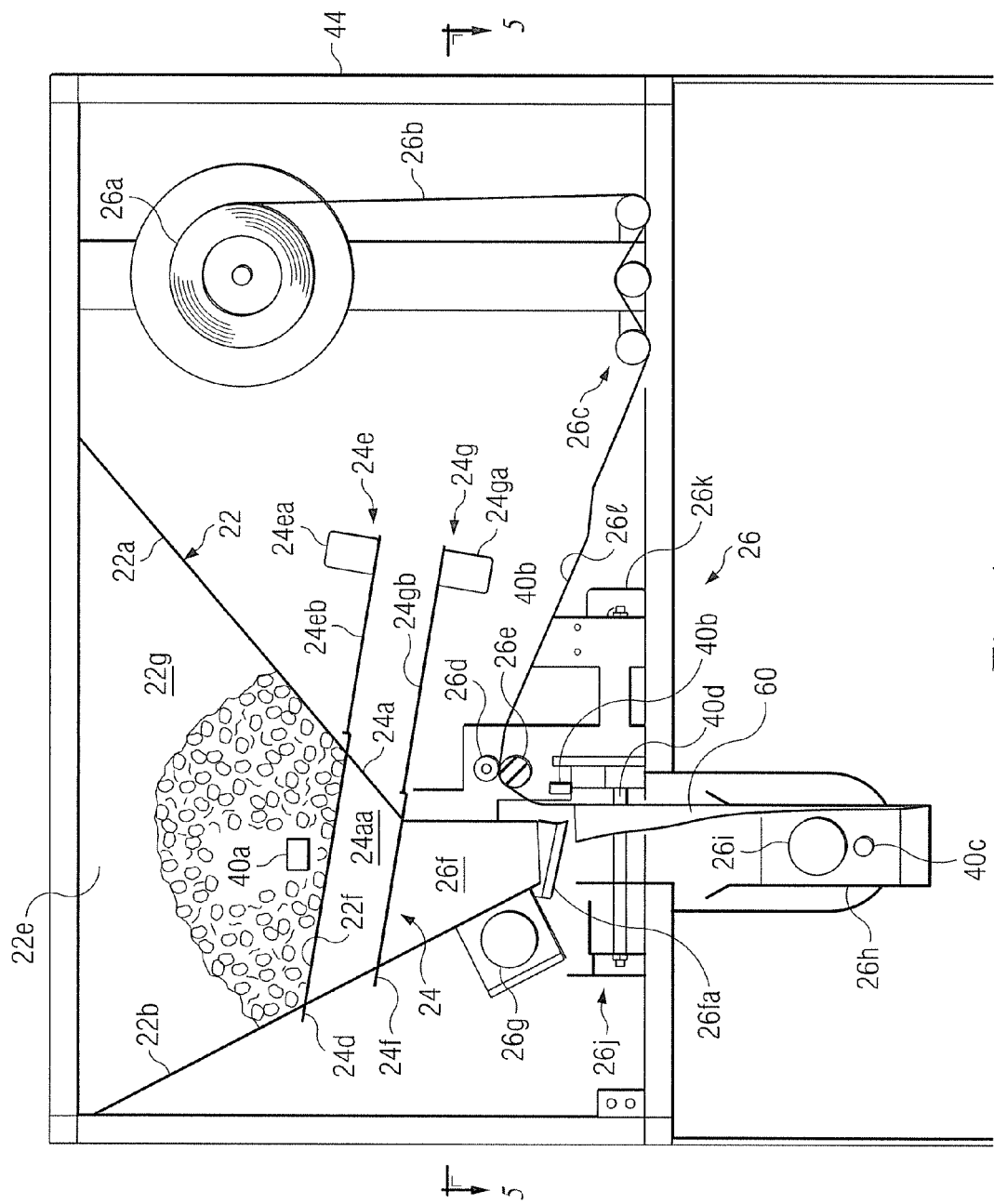
FIG. 4 is a sectional view of the apparatus of FIG. 3.
Figure 5:
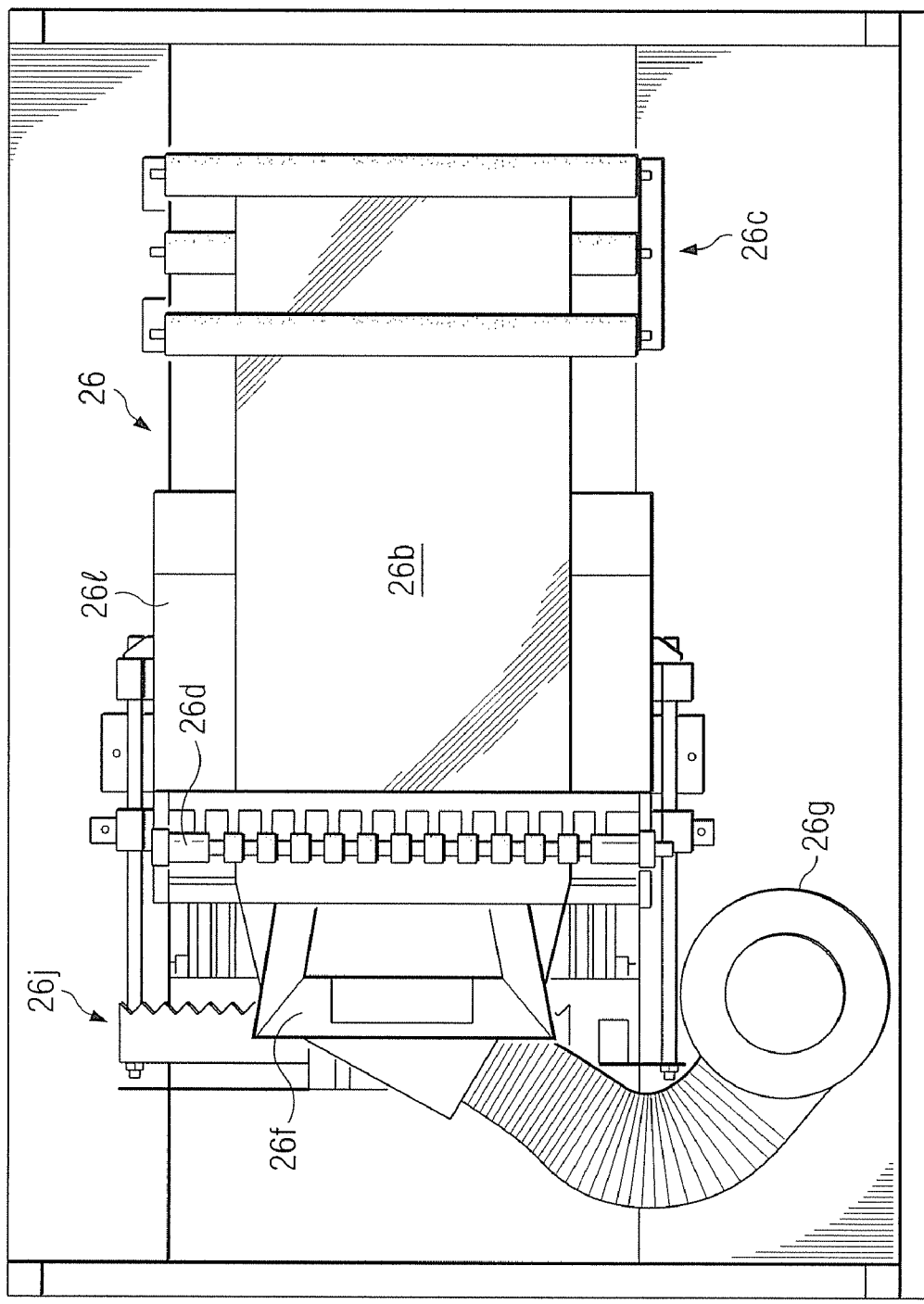
FIG. 5 is a sectional view of the apparatus of FIGS. 3 and 4 taken along line 5-5.

In an exemplary embodiment, as illustrated in FIG. 3 with continuing reference to FIGS. 1 and 2, the ice maker 20 is mounted on a frame 44 and includes an enclosure 20a and a grill panel 20b. The hopper 22, the compartment assembly 24, the bagging mechanism 26 and the control panel 42 of the control system 30 are disposed in, and/or coupled to, the frame 44, which includes panels 44a, 44b, 44c and 44d for enclosing at least respective portions of the hopper 22, the compartment assembly 24, the bagging mechanism 26 and the control panel 42. The freezer 28 includes an enclosure 28a and a door 28b coupled thereto. In an exemplary embodiment, the freezer 28 includes a sensor for determining if the door 28b is open or closed, which sensor may be coupled to the door 28b and is operably coupled to the computer 32.

In an exemplary embodiment, as illustrated in FIGS. 3, 4, 5 and 6 with continuing reference to FIGS. 1 and 2, the hopper 22 includes angularly-extending walls 22a, 22b, 22c and 22d, and defines openings 22e and 22f, and a region 22g. In an exemplary embodiment, the hopper 22 is composed of food-grade stainless steel. The sensor 40a is coupled to the hopper 22. In an exemplary embodiment, the sensor 40a includes a photo cell with laser, with the sensor 40a being arranged so that the photo cell is proximate and faces a service technician when the service technician removes the panel 44b and so that a reflector is positioned opposite the photo cell on the opposing side of the hopper 22.

Figure 6:
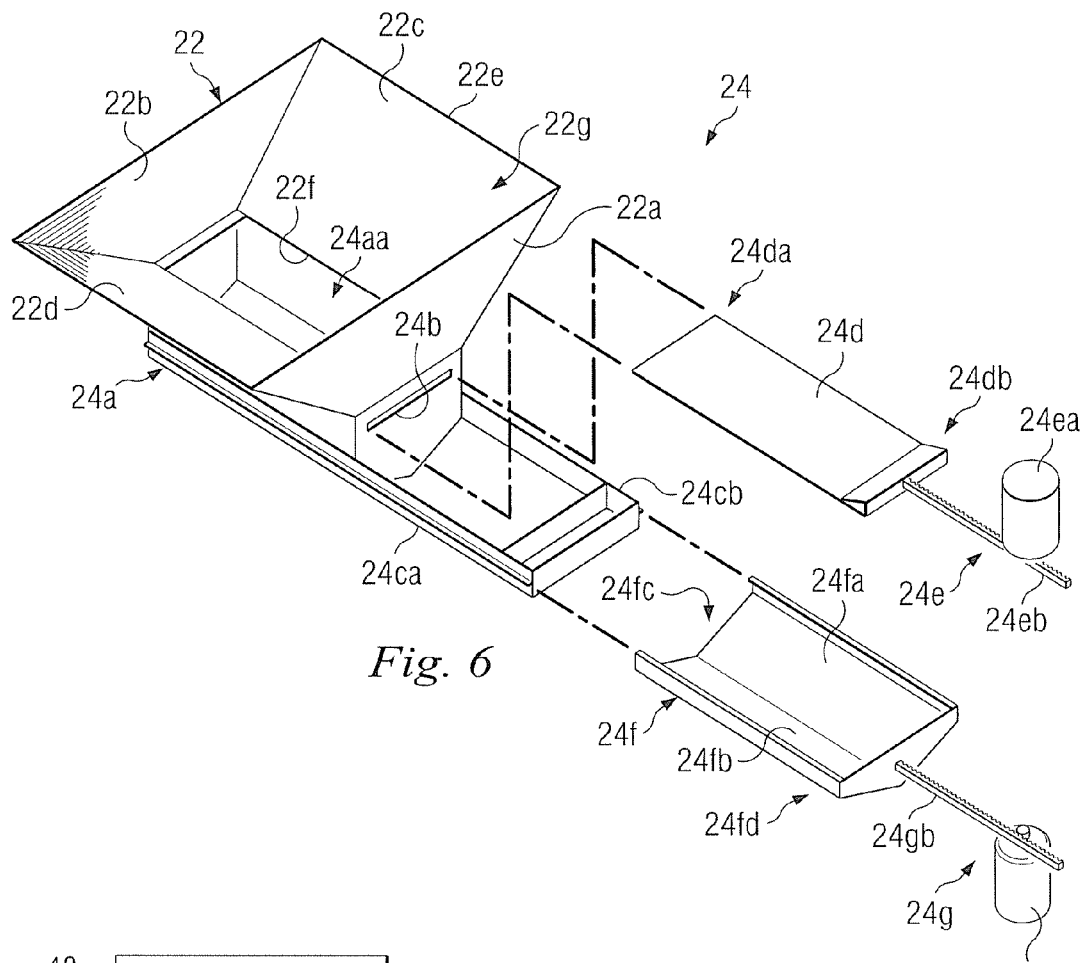
FIG. 6 is partially exploded view of the hopper and the compartment assembly of the apparatus of FIGS. 3, 4 and 5.

As shown in FIG. 6, the compartment assembly 24 includes a four-sided compartment 24a coupled to the hopper 22 so that a region 24aa at least partially defined by the compartment 24a is fluidicly coupled to the region 22g of the hopper 22 via the opening 22f of the hopper 22. A slot 24b is formed through a side 24ab of the compartment 24a. Parallel-spaced rails 24ca and 24cb extend from the compartment 24a. A top door 24d at least partially extends through the slot 24b and is adapted to slide within the slot 24b, thereby controllably blocking the opening 22f of the hopper 22, thereby controllably isolating at least a majority of the region 24aa of the compartment 24a from the region 22g of the hopper 22. The top door 24d includes an open end 24da and a closed end 24db, which is adapted to prevent the top door 24d from sliding any further into the region 24aa of the compartment 24a. An actuator 24e including a motor 24ea and a shaft 24eb extending therefrom is coupled to the top door 24d, with the shaft 24eb being coupled to the closed end 24db of the top door 24d. A bottom door 24f including angularly-extending walls 24fa and 24fb, an open end 24fc and a closed end 24fd, is slidably engaged with the rails 24ca and 24cb and is adapted to slide beneath the compartment 24a for reasons to be described in detail below. An actuator 24g including a motor 24ga and a shaft 24gb extending therefrom is coupled to the bottom door 24f, with the shaft 24gb being coupled to the closed end 24fd of the bottom door 24f. In an exemplary embodiment, each of the actuators 24e and 24g includes a linear actuator. In several exemplary embodiments, instead of, or in addition to the respective motors 24ea and 24ga and the respective shafts 24eb and 24gb, the actuators 24e and 24g may include a wide variety of devices, components and/or systems adapted to generate linear motion including, for example, one or more solenoids, one or more hydraulic actuators and/or any combination thereof.

In an exemplary embodiment, as illustrated in FIGS. 3, 4, 5 and 6 with continuing reference to FIGS. 1 and 2, the bagging mechanism 26 includes a roll 26a, around which a roll of bags 26b is wound. The bags 26b are connected end-to-end to form a substantially continuous roll, and are pre-perforated to a predetermined measurement. In an exemplary embodiment, each of the bags 26b includes digitally-coded information that is adapted to be read by one or more sensors distributed within the apparatus 12, and/or by one or more of the sensors 40a, 40b, 40c and 40d; the digitally-coded information includes, for example, bag number, bag type, bag name and/or any combination thereof. The bags 26b extend from the roll 26a to a plurality of idle rollers 26c, which rollers stretch out, and provide at least a degree of resistance to the travel of, the bags 26b. The bags 26b extend from the rollers 26c and to a feed roller 26d, which is operably associated with a roller 26e, which, in turn, is operably coupled to a feed motor (not shown). In an exemplary embodiment, the feed motor coupled to the roller 26e includes a stepper motor that is operably coupled to the computer 32 of the control system 30. In an exemplary embodiment, the feed motor operably coupled to the roller 26e includes a programmable digital motor. A chute 26f including a holding plate 26fa extends downward from the compartment 24a of the compartment assembly 24. A blower fan 26g is coupled to the chute 26f and is adapted to blow air into the chute 26f for reasons to be described below. A bag basket 26h is disposed below the chute 26f. The sensor 40b is positioned below the chute 26f and above the bag basket 26h. A rotator motor 26i is operably coupled the bag basket 26h and is adapted to rotate the bag basket 26h for reasons to be described. The sensor 40c is operably coupled to the rotator motor 26i. The bagging mechanism 26 further includes a heat seal bar and bag cutter 26j and a motor 26k operably coupled thereto. In an exemplary embodiment, the sensor 40d, one or more limit switches and/or one or more micro-switches are operably coupled to both the motor 26k and the computer 32 of the control system 30, and are adapted to control the motor sequence of the motor 26k. The bagging mechanism 26 further includes a bag guide 26l for guiding the bags 26b to the feed roller 26d.

Figure 7:
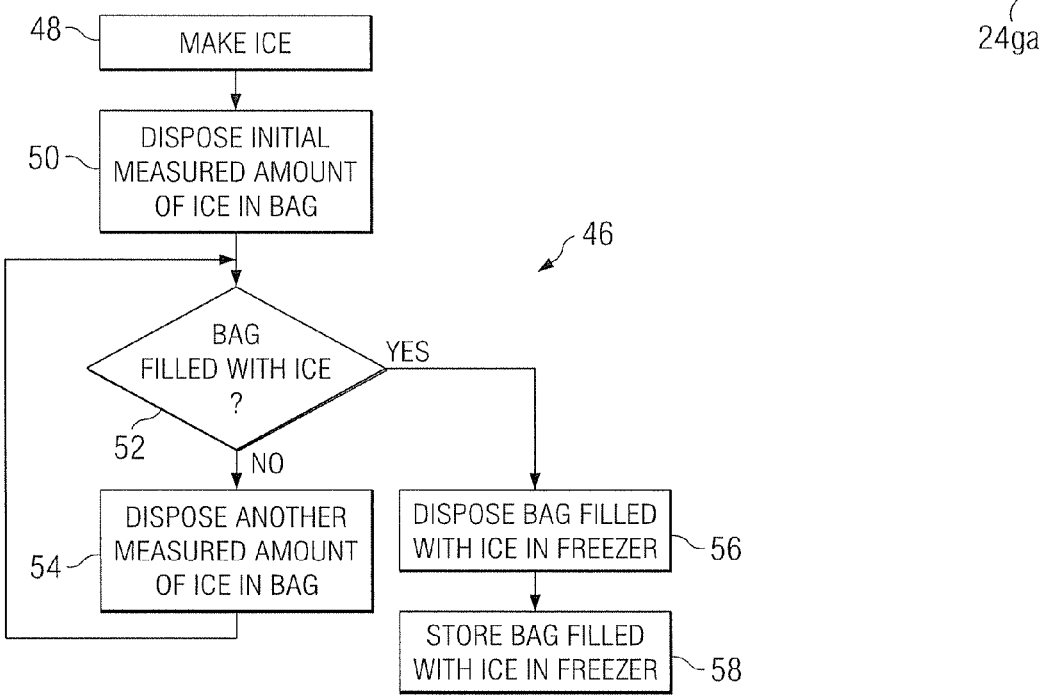
FIG. 7 is a flow chart illustration of a method of operating the apparatus of FIGS. 3, 4 and 5 according to an exemplary embodiment.

In an exemplary embodiment, as illustrated in FIG. 7 with continuing reference to FIGS. 1-6, a method 46 of operating the apparatus 12 includes making ice using the ice maker 20 in step 48, disposing an initial measured amount of ice in a bag in step 50, and determining whether the bag is filled with ice in step 52. If it is determined that the bag is not filled with ice in step 52, then another measured amount of ice is disposed in the bag in step 54, and the steps 52 and 54 are repeated until it is determined that the bag is filled with ice in the step 52. After it is determined that the bag is filled with ice in the step 52, the bag filled with ice is disposed in the freezer 28 in step 56, and the bag filled with ice is stored in the freezer in step 58.

Figure 8:
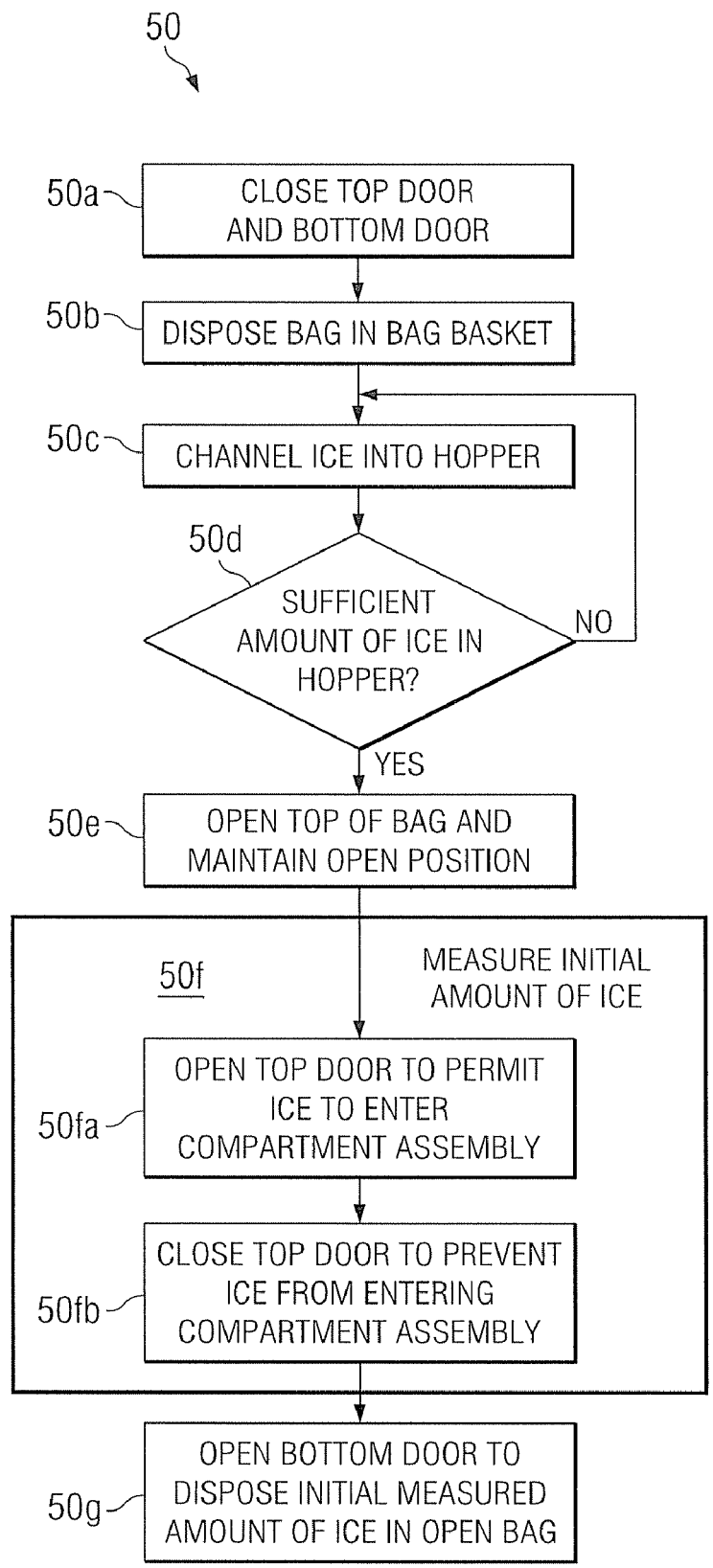
FIG. 8 is a flow chart illustration of a step of the method of FIG. 7 according to an exemplary embodiment.

In an exemplary embodiment, as illustrated in FIG. 8 with continuing reference to FIGS. 1-7, to dispose an initial measured amount of ice in a bag in the step 50 of the method 46, the top door 24*d* is closed, thereby generally isolating the region 24*aa* of the compartment 24*a* of the compartment assembly 24 from the region 22*g* of the hopper 22, and the bottom door 24*f* is closed, thereby generally isolating the internal passage defined by the chute 26*f* of the bagging mechanism 26 from the region 24*aa* of the compartment 24*a* of the compartment assembly 24, in step 50*a*. After the step 50*a*, the region 24*aa* of the compartment 24*a* is at least partially defined by the compartment 24*a*, the top door 24*d* and the bottom door 24*f*. A bag 60 (FIG. 9), which is one of the bags in the roll of bags 26*b*, is disposed in the bag basket 26*h* in step 50*b*. Ice is channeled into the hopper 22 in step 50*c*. It is determined whether there is a sufficient amount of ice in the hopper 22 in step 50*d*. If not, then the steps 50*c* and 50*d* are repeated until it is determined that there is a sufficient amount of ice in the hopper 22 in the step 50*d*. After it is determined that there is a sufficient amount of ice in the hopper 22 in the step 50*d*, the top of the bag 60 is opened and its open position is maintained in the step 50*e*. An initial amount of ice is measured in step 50*f*, which includes opening the top door 24*d* of the compartment assembly 24 to permit ice to enter the region 24*aa* of the compartment 24*a* of the compartment assembly 24 in step 50*fa*, and then closing the top door 24*d* to prevent ice from entering the region 24*aa* of the compartment 24*a* of the compartment assembly 24 in step 50*fb*. In an exemplary embodiment, instead of executing the step 50*e* before the step 54*f*, the step 50*e* is executed after the step 50*f*. After the initial amount of ice is measured in the step 50*f*, the bottom door 24*f* of the compartment assembly 24 is opened in step 50*g* and, as a result, the initial measured amount of ice is disposed in the bag 60.

Figure 9:
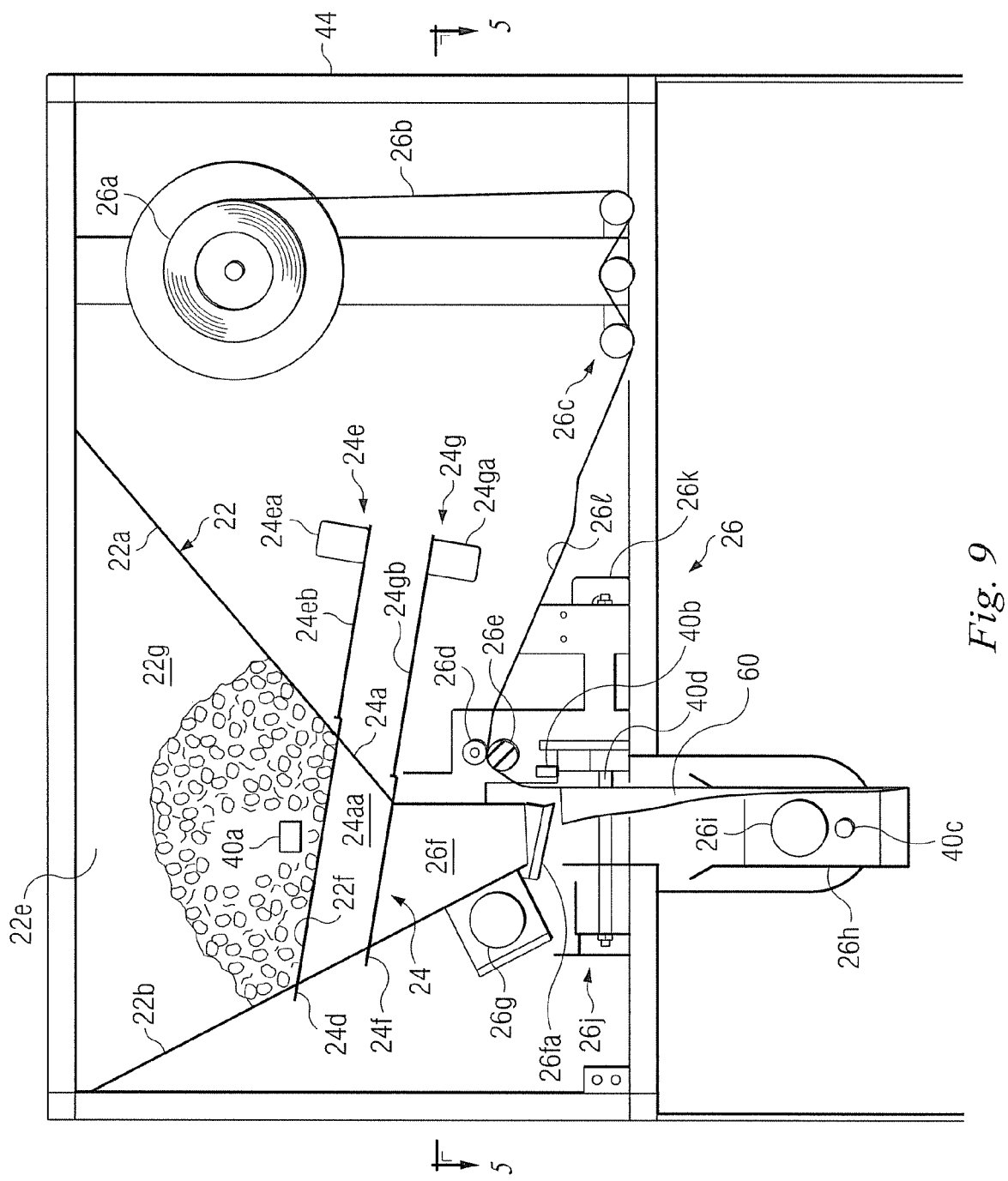
FIG. 9 is a sectional view of the apparatus of FIGS. 3, 4 and 5 in an operational mode during the execution of the step of FIG. 8.

In an exemplary embodiment, as illustrated in FIG. 9 with continuing reference to FIGS. 1-8, to dispose the bag 60 in the bag basket 26*h* in the step 50*b*, the feed motor coupled to the roller 26*e* rotates the roller 26*e*, thereby rotating the roller 26. As a result, the roll of bags 26*b* is pulled and advanced from the roll 26*a*, and at least respective portions of the roll of bags 26*b* roll off of the roll 26*a*, travel through the idle rollers 26*c* (which stretch out, and provide at least a degree of resistance to the travel of, the bags 26*b*), travel over, and are guided by, the bag guide 26*l*, and travel between the rollers 26*d* and 26*e* until the bag 60 is at least partially disposed in the bag basket 26*h*. The position of the bag 60 is detected by the sensor 40*b*, and one or more signals corresponding to the position of the bag 60 is transmitted to the computer 32 of the control system 30 during and/or after the movement of the roll of bags 26*b* within the apparatus 12. The control system 30 controls the movement of the roll of bags 26*b* within the apparatus 12, and thus the disposal of the bag 60 in the bag basket 26*h*, via at least the feed motor coupled to the roller 26*e* and the sensor 40*b*. In an exemplary embodiment, the control system 32 controls the bagging mechanism 26 so that the roll of bags 26*b* is fed by a predetermined length. In an exemplary embodiment, the bag 60 includes a rectangular bar on the right side of the bag 60 and, when the sensor 40*b* reads the rectangular bar, the movement of the rolls of bags 26*b*, including the movement of the bag 60, is stopped at the correct location within the apparatus 12.

In an exemplary embodiment, as illustrated in FIG. 9 with continuing reference to FIGS. 1-8, to channel ice into the hopper in the step 50*c*, ice is introduced from the ice maker 20 and into the region 22*g* of the hopper 22 via the opening 22*e* of the hopper.

In an exemplary embodiment, as illustrated in FIG. 9 with continuing reference to FIGS. 1-8, to determine if there is a sufficient amount of ice in the hopper 22 in the step 50*d*, the sensor 40*a* senses the amount of ice in the region 22*g* of the hopper 22. In an exemplary embodiment, the sensor 40*a* includes a photo cell with laser and the sensor 40*a* senses the amount of ice in the region 22*g* of the hopper 22 via the laser beam. In an exemplary embodiment, the sensor 40*a* is positioned so that the sufficient amount of ice, the presence of which is determined in the step 50*d*, is substantially equal to the amount of ice that can fill the region 24*aa* of the compartment 24*a* of the compartment assembly 24. In an exemplary embodiment, the sensor 40*a* is positioned so that the sufficient amount of ice, the presence of which is determined in the step 50*d*, is substantially equal to the amount of ice that can fill the bag 60.

Figure 10:
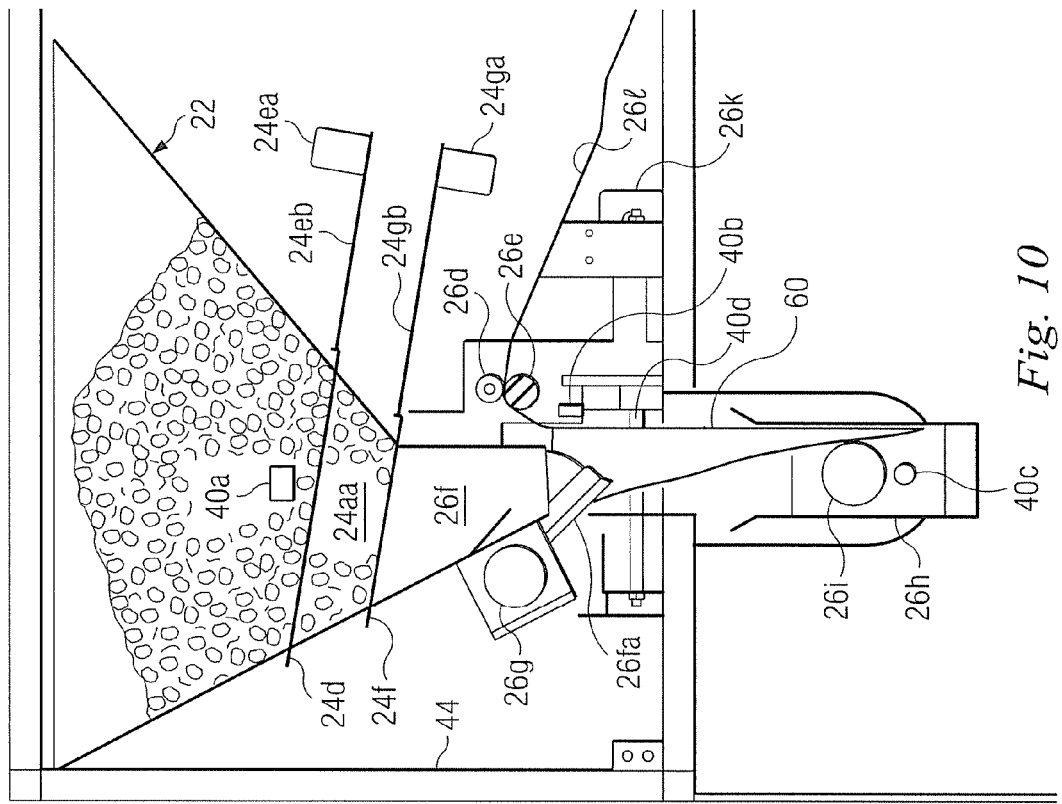
FIG. 10 is a view similar to that of FIG. 9, but depicting the apparatus of FIGS. 3, 4 and 5 in another operational mode during the execution of the step of FIG. 8.

In an exemplary embodiment, as illustrated in FIG. 10 with continuing reference to FIGS. 1-9, to open the top of the bag 60 and maintain the open position in the step 50*e*, the blower fan 26*g* is activated and the top of the bag 60 is blown open. Before, during or after the activation of the blower fan 26*g*, the holding plate 26*fa* swings downward and clockwise, as viewed in FIG. 10, thereby maintaining the open position of the top of the bag 60.

In an exemplary embodiment, as illustrated in FIG. 10 with continuing reference to FIGS. 1-9, to open the top door 24*d* in the step 50*fa* of the step 50*f*, the motor 24*ea* of the actuator 24*e* is activated so that the shaft 24*eb* causes the top door 24*d* to move at least partially through the slot 24*b* and towards the motor 24*ea*. As a result, the region 24*aa* of the compartment 24*a* of the compartment assembly 24 is no longer isolated from the region 22*g* of the hopper 22, and thus ice is permitted to enter the region 24*aa* via the opening 22*f* of the hopper 22. As a result, ice enters and fills up the region 24*aa* of the compartment 24*a* of the compartment assembly 24, and is supported by the bottom door 24*f*, which remains in its closed position, and the region 24*aa* is at least partially defined by the compartment 24*a* and the bottom door 24*f*.

In an exemplary embodiment, as illustrated in FIG. 10 with continuing reference to FIGS. 1-9, to close the top door 24*d* after ice enters and fills up the region 24*aa*, the motor 24*ea* is activated so that shaft 24*eb* causes the top door 24*d* to move at least partially through the slot 24*b*, and away from the motor 24*ea*, until the region 24*aa* is again generally isolated from the region 22*g* so that ice is prevented from entering the region 24*aa* from the region 22*g*. In an exemplary embodiment, the movement of the top door 24*d* continues until the closed end 24*db* contacts the side 24*ab* of the compartment 24*a* and, as a result, the region 24*aa* is again generally isolated from the region 22*g* so that ice is prevented from entering the region 24*aa* from the region 22*g*, and the region 24*aa* is at least partially defined by the compartment 24*a*, the top door 24*d* and the bottom door 24*f*. As a result of the execution of the steps 50*fa* and 50*fb*, an initial amount of ice is measured using the region 24*aa* of the compartment assembly 24. Since the volume defined by the region 24*aa* of the compartment 24*a* is predetermined, the measurement of the initial amount of ice is possible in the step 50*f*. In an exemplary embodiment, the activation of the motor 24*ea* in each of the steps 50*fa* and 50*fb* is controlled by the control system 30. In an exemplary embodiment, the control system 30 activates the motor 24*ea* in the step 50*fa* after the control system 30 determines that there is sufficient ice in the hopper 22 in the step 50*d* via the sensor 40*a*.

Figure 11:
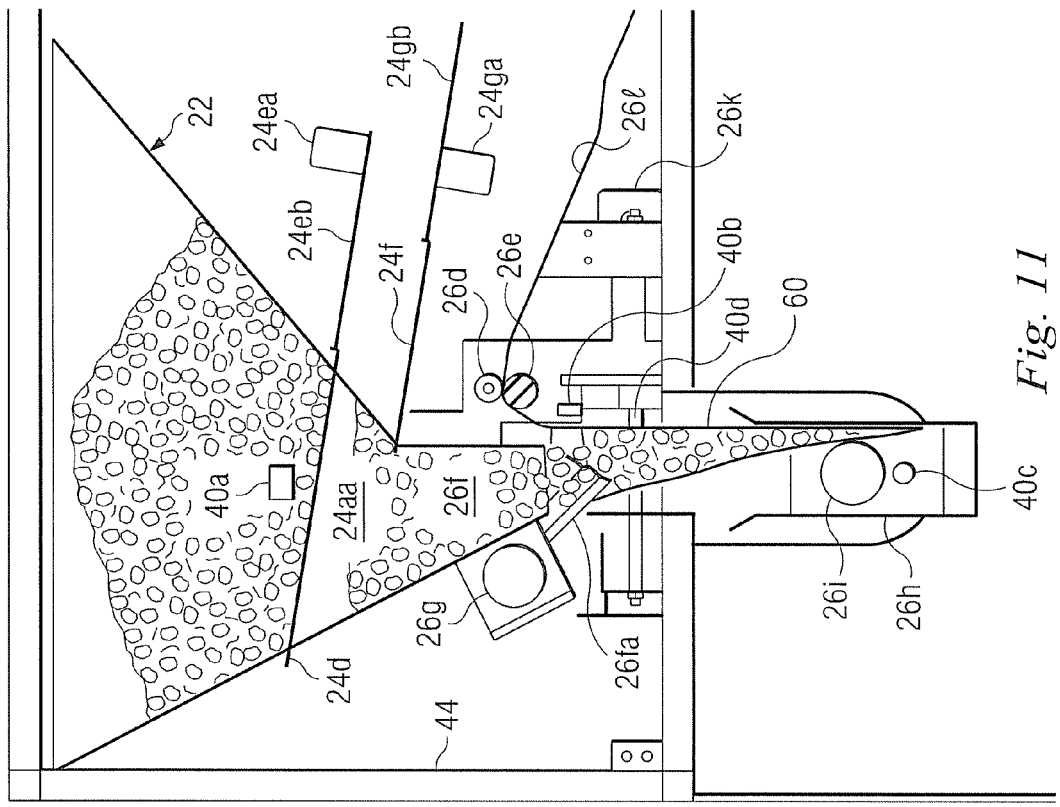
FIG. 11 is a view similar to that of FIGS. 9 and 10, but depicting the apparatus of FIGS. 3, 4 and 5 in yet another operational mode during the execution of the step of FIG. 8.

In an exemplary embodiment, as illustrated in FIG. 11 with continuing reference to FIGS. 1-10, to open the bottom door 24*f* of the compartment assembly 24 in the step 50*g*, the motor 24*ga* of the actuator 24*g* is activated so that the shaft 24*gb* causes the bottom door 24*f* to move towards the motor 24*ga*. As a result, the region 24*aa* is at least partially defined by the compartment 24*a* and top door 24*d*, and the region 24*aa* of the compartment 24*a* of the compartment assembly 24 is no longer isolated from the internal passage defined by the chute 26*f*, and thus the initial measured amount of ice in the region 24*aa* is permitted to exit the region 24*aa*, falling through the chute 26*f* and into the bag 60 via the open top thereof. As a result, the initial measured amount of ice is disposed in the bag 60.

In an exemplary embodiment, after the initial measured amount of ice is disposed in the bag 60 in the step 50, it is determined whether the bag 60 is filled with ice in the step 52, as noted above. In an exemplary embodiment, to execute the step 52, the control system 30 determines the number of times or cycles that ice must be disposed in the bag 60 from the region 24*aa* of the compartment assembly 24 in order to fill the bag 60. In an exemplary embodiment, to execute the step 52, the control system 30 determines the number of times or cycles that ice must be disposed in the bag 60 from the region 24*aa* of the compartment assembly 24 in order to fill the bag 60 in response to the determination of the size of the bag 60 by the control system 30. In an exemplary embodiment, the size of the bag 60 is determined by the control system 30 using the sensor 40*b*, which reads digitally-coded information on the bag 60, the digitally-coded information including the size of the bag 60.

If it is determined that the bag 60 is not filled with ice in the step 52, then another measured amount of ice is disposed in the bag 60 in the step 54, as noted above.

Figure 12:
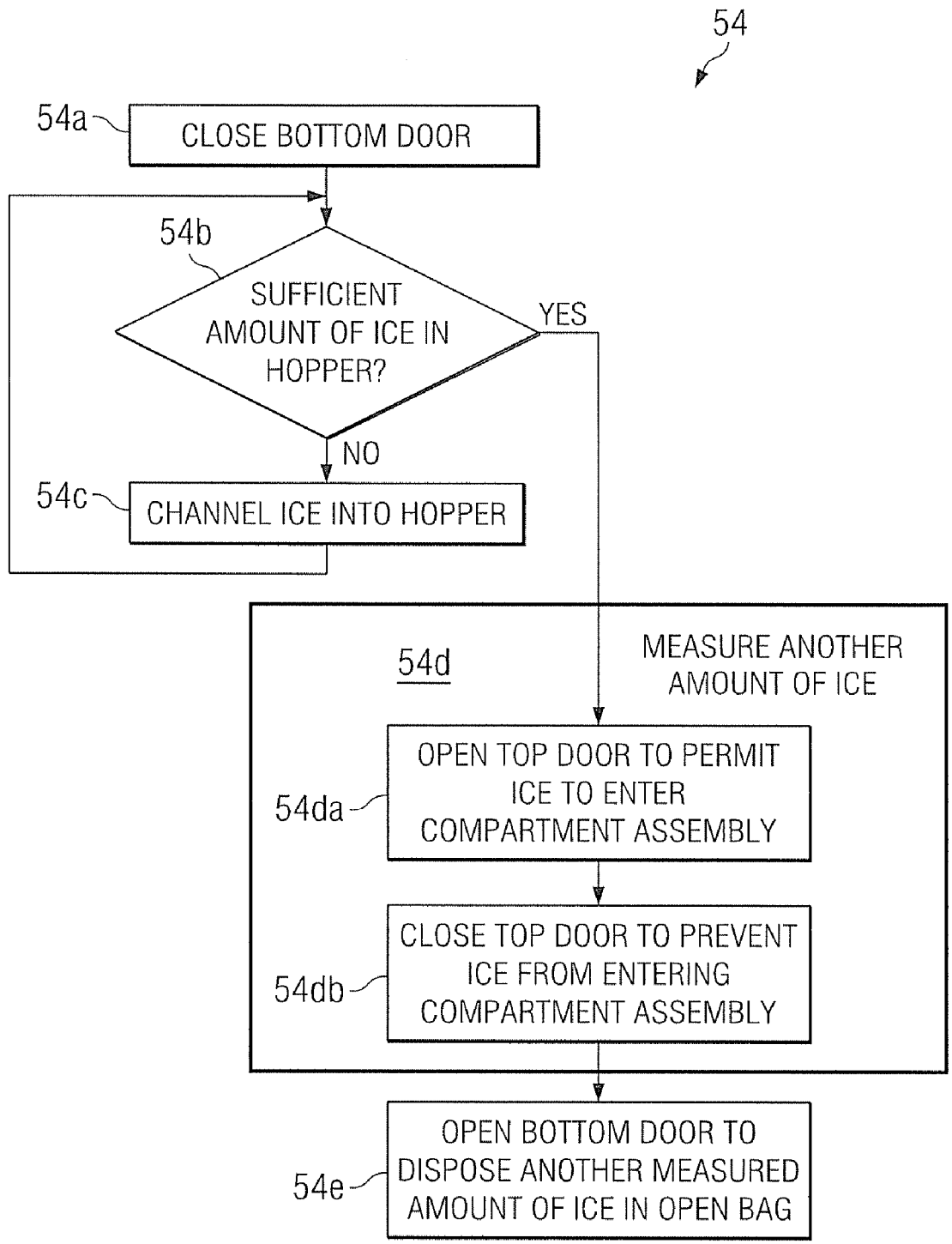
FIG. 12 is a flow chart illustration of another step of the method of FIG. 7 according to an exemplary embodiment.
Figure 13:
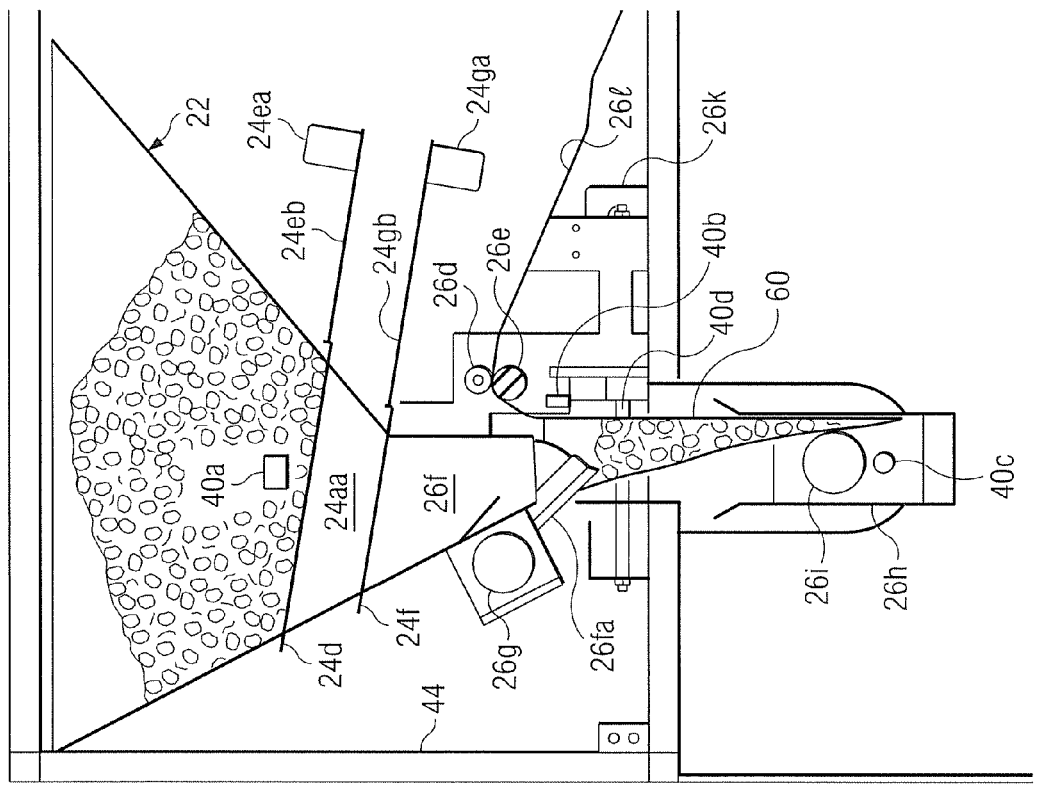
FIG. 13 is a sectional view of the apparatus of FIGS. 3, 4 and 5 in an operational mode during the execution of the step of FIG. 12.

In an exemplary embodiment, as illustrated in FIGS. 12 and 13 with continuing reference to FIGS. 1-10, to dispose another measured amount of ice in the bag 60 in the step 54 of the method 46, the bottom door 24*f* is closed in the step 54*a*, as shown in FIG. 13. It is then determined whether there is a sufficient amount of ice in the hopper 22 in step 54*b*, which step is substantially similar to the step 50*d* and therefore will not be described in further detail. If it is determined that there is not a sufficient amount of ice in the hopper 22 in the step 54*b*, then ice is channeled into the hopper 22 in step 54*c*. The steps 54*b* and 54*c* are repeated until it is determined that there is a sufficient amount of ice in the hopper 22 in the step 54*b*. After it is determined that there is a sufficient amount of ice in the hopper 22 in the step 54*b*, then another amount of ice is measured in step 54*d*, which step is substantially similar to the step 50*f*. The step 54*d* includes opening the top door 24*d* of the compartment assembly 24 to permit ice to enter the region 24*aa* from the region 22*g* in step 54*da*, and then closing the top door 24*d* to prevent ice from entering the region 24*aa* from the region 22*g* in step 54*db*. The steps 54*da* and 54*db* are substantially similar to the steps 50*fa* and 50*fb*, respectively, and therefore will not be described in further detail. After the other amount of ice is measured in the step 54*d*, the bottom door 24*f* of the compartment assembly 24 is opened in step 54*e* and, as a result, the other measured amount of ice is disposed in the bag 60. The step 54*e* is substantially similar to the step 50*g* and therefore will not be described in further detail.

As noted above, the steps 52 and 54 are repeated until it is determined in the step 52 that the bag 60 is filled with ice, at which point the ice-filled bag 60 is disposed in the freezer 28 in the step 56. In an exemplary embodiment, if it is determined that the size of the bag 60 is a seven-pound bag, then ice is disposed in the bag 60 from the region 24*aa* two times in order to fill the bag 60, and it is determined that the bag 60 is filled with ice in the step 52 by determining that ice has been disposed in the bag 60 from the region 24*aa* two times. In an exemplary embodiment, if it is determined that the size of the bag 60 is a ten-pound bag, then ice is disposed in the bag 60 from the region 24*aa* three times in order to fill the bag 60, and it is determined that the bag 60 is filled with ice in the step 52 by determining that ice has been disposed in the bag 60 from the region 24*aa* three times.

Figure 14:
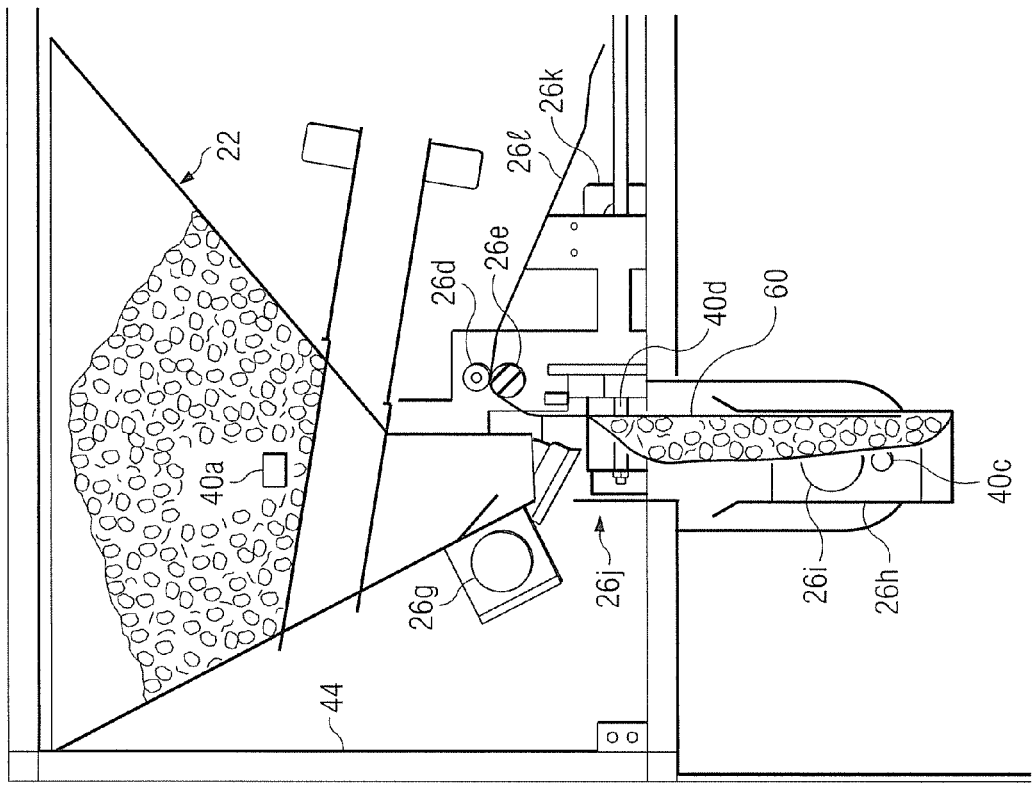
FIG. 14 is a view similar to that of FIG. 13, but depicting the apparatus of FIGS. 3, 4 and 5 in another operational mode during the execution of the step of FIG. 12.
Figure 15:
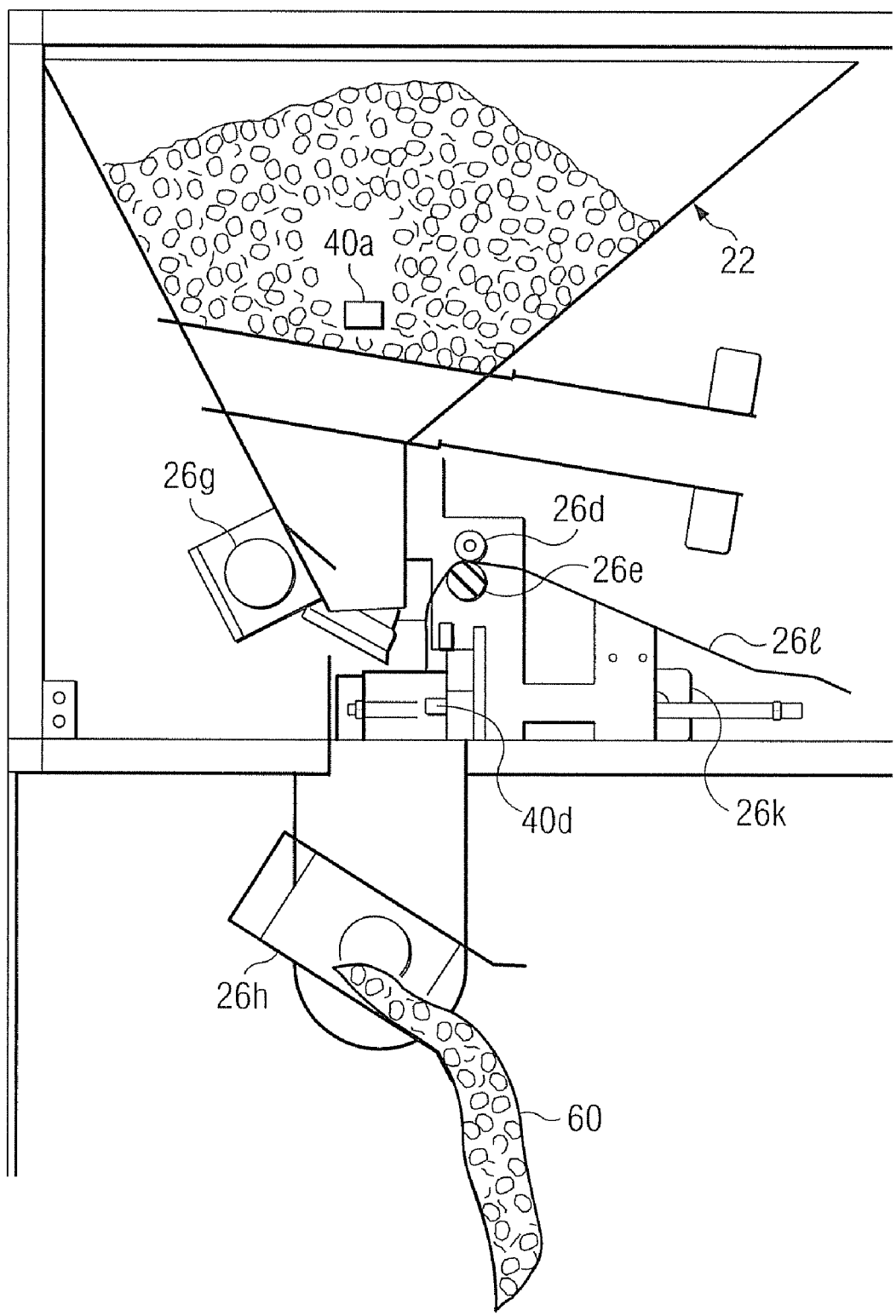
FIG. 15 is a view similar to that of FIGS. 13 and 14, but depicting the apparatus of FIGS. 3, 4 and 5 in yet another operational mode during the execution of the step of FIG. 12.

In an exemplary embodiment, as illustrated in FIGS. 14 and 15 with continuing reference to FIGS. 1-13, to dispose the ice-filled bag 60 in the freezer 28 in the step 56, the bag 60 is sealed and separated from the remainder of the roll of bags 26*b* by activating the motor 26*k* so that a shaft operably coupled to the motor 26*k* causes the heat seal bar and bag cutter 26*j* to move from left to right, as viewed in FIG. 14. In response to the movement of the heat seal bar and bag cutter 26*j*, the bag 60 is heat sealed with a heat seal strip and the bag 60 is cut off and separated from the remainder of the roll of bags 26*b*, as illustrated in FIG. 14. In an exemplary embodiment, the control system 30 controls the heat sealing and separation of the bag 60 via at least the motor 26*k* and the sensor 40*d*. In an exemplary embodiment, the heat sealing of the bag 60 is controlled by the control system 30 via at least the motor 26*k*, the sensor 40*d* and/or one or more thermostats. After the bag 60 is heat sealed and separated, the motor 26*i* is then activated to cause the bag basket 26*h* to rotate clockwise, as viewed in FIG. 15. In response to the rotation of the bag basket 26*h*, the ice-filled bag 60 falls into the freezer 28 and is thereby disposed in the freezer 28. After the ice-filled bag 60 is disposed in the freezer 28, the motor 26*i* is activated to cause the bag basket 26*h* to rotate back to its upright position shown in FIG. 14. In an exemplary embodiment, the control system 30 controls the rotation of the bag basket 26*h* and the disposal of the ice-filled bag 60 in the freezer 28 via at least the motor 26*i* and the sensor 40*c*, which sensor may be used to, for example, detect the absence of the ice-filled bag 60 from the bag basket 26*h*.

In an exemplary embodiment, after the bag 60 is disposed in the freezer 28 in the step 56, the bag 60 is stored in the freezer 28 in the step 58 of the method 46, as noted above, until the door 28*b* of the freezer 28 is opened and the bag 60 is removed from the freezer 28. In several exemplary embodiments, as a result of the execution of the method 46, ice is made, bagged and stored at the same location within the apparatus 12, thereby substantially eliminating or at least substantially reducing one or more of the following: the need for transporting ice to the freezer 28 from a remote ice-making location, the risk of an inadequate inventory of ice in the freezer 28, the risk of delivery-related problems, the risk of wet and/or slippery floors, and/or the risk of unwanted bridging of ice. Moreover, as a result of its design, the apparatus 12 uses less floor space.

Figure 16:
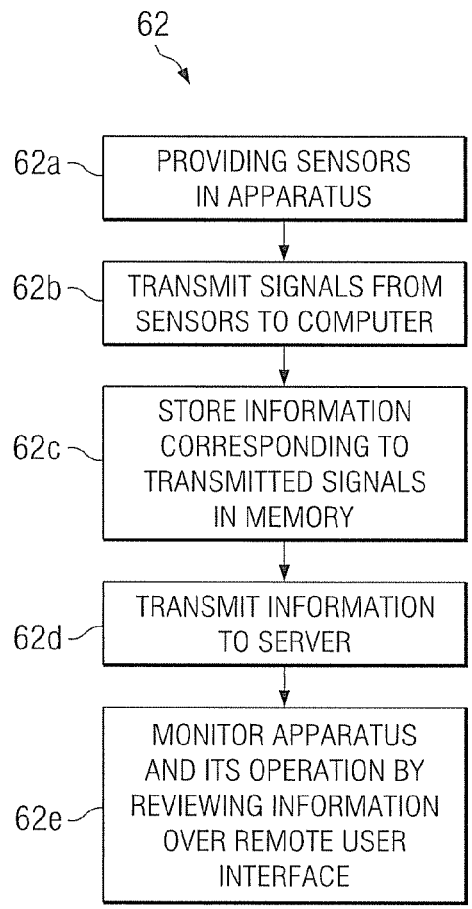
FIG. 16 is a flow chart illustration of a method of monitoring the apparatus of FIGS. 1, 3, 4 and 5.

In an exemplary embodiment, as illustrated in FIG. 16 with continuing reference to FIGS. 1-15, a method 62 of remotely monitoring the apparatus 12 and/or the execution of the method 46 includes providing sensors in the apparatus 12, including providing the sensors 40*a*, 40*b*, 40*c* and 40*d* in the apparatus 12 in the manner described above, in step 62*a*, and reading the provided sensors by transmitting signals from the provided sensors to the computer 32 of the control system 30 in step 62*b*. Information corresponding to the transmitted signals is then stored in the memory 36 of the computer 32 of the control system 30 in step 62*c*. In an exemplary embodiment, the signals transmitted in the step 62*b* may be converted, conditioned and/or processed by the processor 34 and/or one or more other controllers, one or more data acquisition units, and/or other devices before, during or after being stored in the memory 36 in the step 62*c*. The stored information is then transmitted to the central server 14 via the communication module 38 and the network 16 in step 62*d*. The information is then reviewed and monitored over one or more of the remote user interfaces 18a and 18b via the network 16 in step 62e, thereby permitting the remote monitoring of the apparatus 12 and its operation. In an exemplary embodiment, the network 16 is the Internet and the server 14 hosts a secure web page and/or web site at which the information can be reviewed and monitored using the remote user interfaces 18a and/or 18b. As a result, users at remote locations from the apparatus 12 are permitted to access the Internet and monitor the ice making, ice bagging and ice distribution operations of the apparatus 12, and troubleshoot any problems with the apparatus 12 based on diagnostic information displayed over the web page hosted by the server 14. In an exemplary embodiment, the information is reviewed and monitored in the step 62e to ensure production of ice bags for reporting, troubleshooting and/or maintenance purposes. In an exemplary embodiment, the information reviewed in the step 62e includes the quantity of bags filled with ice, the quantity of unused bags, the sales history, the temperature in the merchandiser or freezer 28, and/or the presence and/or absence of any error and/or diagnostic codes. In several exemplary embodiments, the respective operations of one or more of the ice maker 20, the hopper 22, the compartment assembly 24, the bagging mechanism 26, the freezer 28 and/or any combination thereof are remotely monitored during the execution of the method 62.

In an exemplary embodiment, to transmit the information in the step 62d, the information is transmitted to the server 14 from the communication module 38 via the network 16 via, for example, wireless communication, hardwire communication, a satellite frequency signal, and/or any combination thereof. In an exemplary embodiment, the information is transmitted in the step 62 pursuant to a predetermined transmission schedule.

In an exemplary embodiment, the method 62 is executed before, during and/or after the operation of the apparatus 12, including the execution of the method 46.

Figure 17:
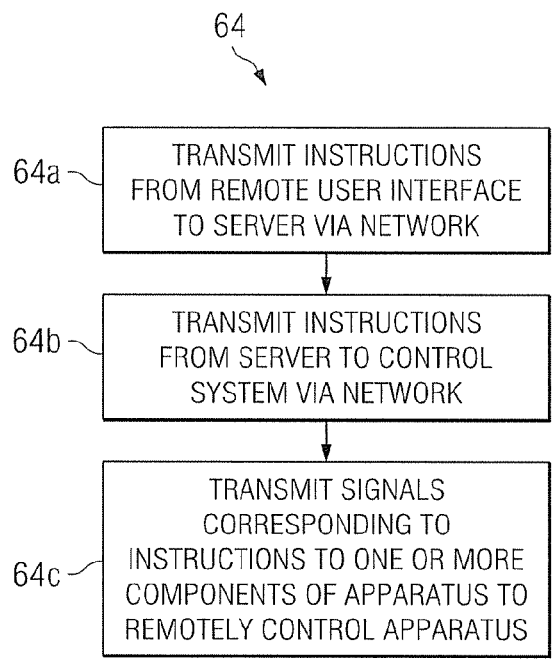
FIG. 17 is a flow chart illustration of a method of remotely controlling the apparatus of FIGS. 1, 3, 4 and 5.

In an exemplary embodiment, as illustrated in FIG. 17 with continuing reference to FIGS. 1-16, a method 64 of remotely controlling the apparatus 12 includes transmitting instructions from one or more of the remote user interfaces 18a and 18b to the server 14 via the network 16 in step 64a, transmitting instructions from the server 14 to the communication module 38 of the control system 30 via the network 16 in step 64b, and transmitting signals corresponding to the transmitted instructions from the computer 30 to one or more components of the apparatus 12 to control the operation thereof in step 64c, including, for example, transmitting signals to the ice maker 20, the hopper 22, the compartment assembly 24, the bagging mechanism 26, the freezer 28, the control system 30 and/or any combination thereof. In an exemplary embodiment, the instructions transmitted in the step 64b are stored in the memory 36. In an exemplary embodiment, the instructions transmitted in the steps 64a and/or 64b include instructions for updating files stored in the memory 36, and/or updating operational steps and/or sequences for one or more components of the apparatus 12. In an exemplary embodiment, the instructions transmitted in the steps 64a and/or 64b are transmitted pursuant a predetermined transmission schedule.

In an exemplary embodiment, the method 64 is executed before, during or after the execution of the method 62. In an exemplary embodiment, the method 64 is executed in response to the execution of the method 62. In an exemplary embodiment, the method 64 is executed before, during or after the operation of the apparatus 12, including the execution of the method 46.

Figure 18:
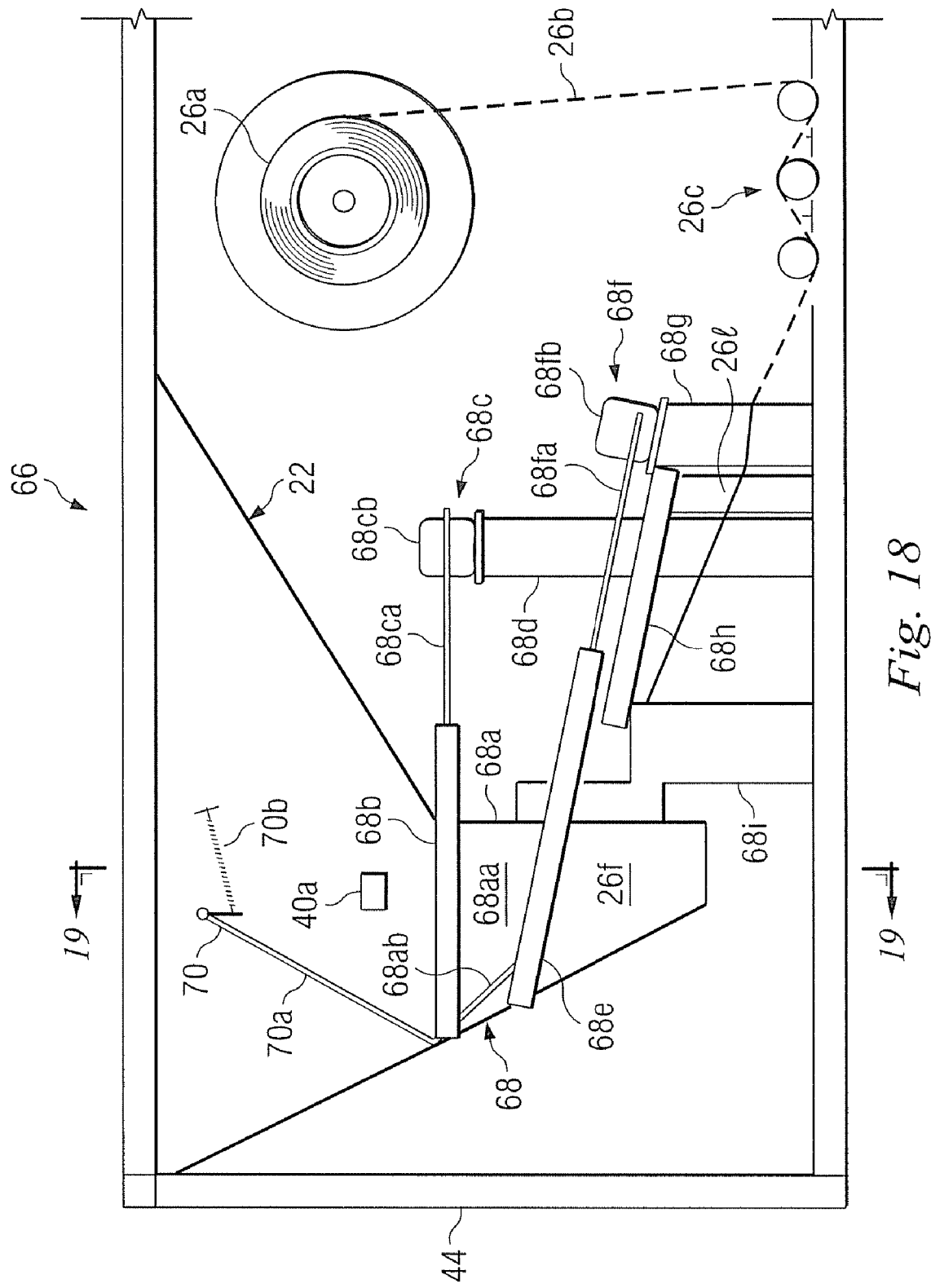
FIG. 18 is a sectional view of the apparatus of FIG. 1 according to another exemplary embodiment, the apparatus including a top door and a bottom door.

In an exemplary embodiment, as illustrated in FIGS. 18 and 19 with continuing reference to FIGS. 1-17, another embodiment of an ice bagging apparatus is generally referred to by the reference numeral 66, and is similar to the apparatus 12 and contains several parts of the apparatus 12, which parts are given the same reference numerals. Instead of the compartment assembly 24, the apparatus 66 includes a compartment assembly 68 including a four-sided compartment 68a coupled to the hopper 22, the compartment 68a at least partially defining a region 68aa and including an adjustable sizing plate 68ab disposed in the region 68aa for adjusting the size or volume of the region 68aa. In an exemplary embodiment, the adjustable sizing plate 68ab is hingedly coupled to a corner of the compartment 68a. A top door 68b is adapted to move between the hopper 22 and the compartment 68a to controllably isolate the compartment 68a from the hopper 22 and thereby controllably prevent ice from entering the compartment 68a from the hopper 22. The top door 68b extends horizontally, as viewed in FIG. 18a, and is operably coupled to a shaft 68ca of an actuator 68c including a motor 68cb coupled to the shaft 68ca. A support 68d upon which the motor 68cb is mounted is disposed within the frame 44. A bottom door 68e is adapted to move between the compartment 68a and the chute 26f of the bagging mechanism 26 to controllably isolate the chute 26f from the region 68aa of the compartment 68a and thereby controllably prevent ice from entering the chute 26f from the region 68aa. The bottom door 68e extends angularly, as viewed in FIG. 18a, and is operably coupled to a shaft 68fa of an actuator 68f including a motor 68fb coupled to the shaft 68fa. A support 68g upon which the motor 68fb is mounted is disposed within the frame 44. A drain pan 68h is disposed below at least a portion of the bottom door 68e so that at least a portion of the drain pan 68h is always below at least a portion of the bottom door 68e. The drain pan 68h is supported by the support 68g and a support 68i. An agitator assembly 68j is operably associated with the hopper 22 and includes an angularly-extending agitating member 68ja disposed within the region 22g of the hopper 22, and a spring 68jb coupled to the agitating member 68ja. In an exemplary embodiment, the agitating member 68ja is spring loaded by the spring 68jb. In an exemplary embodiment, the spring 68jb is positioned outside of the hopper 22. In an exemplary embodiment, the spring 68jb is positioned within the hopper 22. In several exemplary embodiments, instead of, or in addition to the respective motors 68cb and 68fb and the respective shafts 68ca and 68fa, the actuators 68c and 68f may include a wide variety of devices, components and/or systems adapted to generate linear motion including, for example, one or more solenoids, one or more hydraulic actuators and/or any combination thereof. The remaining components of the apparatus 66, several of which are not shown in FIGS. 18 and 19, are substantially similar to corresponding components in the apparatus 12 and therefore will not be described in detail.

In an exemplary embodiment, as illustrated in FIGS. 20a and 20b with continuing reference to FIGS. 1-19, the top door 68b includes a flat plate 68ba, an open end 68bb and an opposing closed end 68bc that protrudes from the flat plate 68ba, as viewed in FIG. 20b. In an exemplary embodiment, the flat plate 68ba is 9 inches by 12 inches.

In an exemplary embodiment, as illustrated in FIGS. 21a and 21b with continuing reference to FIGS. 1-20b, the bottom door 68e includes walls 68ea and 68eb, which extend angularly towards each other to form a generally V-shaped cross-section, an open end 68ec, and an opposing closed end 68ed including a vertically-extending wall 68eda that extends between the angularly-extending walls 68ea and 68eb. A through-opening, in the form of a drain slot 68ee, is formed through the walls 68ea and 68eb and is positioned near the closed end 68ed. In an exemplary embodiment, the bottom door 68e is 13 inches by 13 inches.

In an exemplary embodiment, with continuing reference to FIGS. 1-21b, to measure an amount of ice using the compartment assembly 68, the top door 68b and the bottom door 68e are closed. After it is determined that there is a sufficient amount of ice in the hopper 22, the motor 68cb of the actuator 68c is activated so that the shaft 68ca causes the top door 68b to move towards the motor 68cb, thereby opening the top door 68b. As a result, the region 68aa of the compartment 68a is no longer isolated from the region 22g of the hopper 22, and thus ice is permitted to enter the region 68aa of the compartment 68a. As a result, ice enters and fills up the region 68aa of the compartment 68a, and is supported by the bottom door 68e, which remains in its closed position. The top door 68b is then closed by activating the motor 68cb of the actuator 68c so that the shaft 68ca causes the top door 68b to move away from the motor 68cb, until the top door 68b is closed and the region 68aa of the compartment 68a is again generally isolated from the region 22g of the hopper 22, and ice is prevented from entering the region 68aa from the region 22g. In an exemplary embodiment, the movement of the top door 68b away from the motor 68cb continues until the closed end 68bc of the top door 68b contacts the hopper 22 and/or the compartment 68a. As a result of the opening and then the closing of the top door 68b, an amount of ice is measured using the region 68aa of the compartment, which measurement is possible because the volume defined by the region 68aa is predetermined.

In an exemplary embodiment, to dispose the amount of ice measured using the compartment assembly 68 in a bag, the bottom door 68e is then opened by activating the motor 68fb so that the shaft 68fa causes the door 68e to move towards the motor 68fb. As a result, the region 68aa of the compartment 68a is no longer generally isolated from the internal passage defined by the chute 26f, and thus the measured amount of ice in the region 68aa is permitted to fall through the chute 26f and into a bag in the manner described above. In an exemplary embodiment, after the measured amount of ice has fallen through the chute 26f, the motor 68fb is activated so that the shaft 68fa cause the bottom door 68e to move away from the motor 68fb, until the bottom door 68e is closed and the region 68aa of the compartment 68a is again generally isolated from the internal passage defined by the chute 26f, and ice is prevented from entering the internal passage defined by the chute 26f from the region 68aa. In an exemplary embodiment, the movement of the bottom door 68e away from the motor 68fb continues until the closed end 68ed of the bottom door 68e contacts the compartment 68a and/or the chute 26f.

In an exemplary embodiment, before, during or after the measurement of an amount ice in the compartment 68a, and before, during or after the disposal of the measured amount of ice in a bag, gravity causes any liquid and/or relatively small ice particles on the bottom door 68e to slide down the angularly-extending bottom door 68e, and fall through the drain slot 68ee and into the drain pan 68h. As a result, the compartment 68a is drained. This drainage is possible at all times during the operation of the bottom door 68e because a portion of the drain pan 68h is always positioned beneath the drain slot 68ee, regardless of whether the bottom door 68e is in its open position, its closed position, or a position between its open and closed positions. The generally V-shaped cross-section provided by the angularly-extending walls 68ea and 68eb channels any liquid and/or relatively small particles of ice towards the center of the bottom door 68e, thereby facilitating the channeling of the liquid and/or the relatively small particles of ice towards the drain slot 68ee.

In an exemplary embodiment, during the operation of the apparatus 66, the agitating member 70a agitates the ice disposed in the region 22g of the hopper 22, thereby reducing the risk of bridging between the ice cubes or particles and/or keeping the ice cubes or particles generally separated so that the ice cubes particles more easily fall into and enter the compartment 68a when the top door 68b is opened.

In an exemplary embodiment, during the operation of the apparatus 66, the position of the sizing plate 68ab may be adjusted to adjust the size of the region 68aa and thereby adjust the amount of ice measured in the compartment 68a. In an exemplary embodiment, the size of the region 68aa is decreased by moving at least the bottom portion the plate 68ab towards the center of the bottom door 68e. In an exemplary embodiment, the size of the region 68aa is increased by moving at least the bottom portion of the plate 68ab away from center of the bottom door 68e.

In an exemplary embodiment, the operation of the remaining portions of the apparatus 66, including during the execution of the methods 46, 62 and 64, is substantially similar to the operation of corresponding remaining portions of the apparatus 12, including during the execution of the methods 46, 62 and 64, and therefore the operation of the remaining portions of the apparatus 66 will not be described in detail.

In an exemplary embodiment, at least one other apparatus substantially similar to the apparatus 12 and/or 66 and located at the same or another location may be operably coupled to the server 14 via the network 16. In an exemplary embodiment, a plurality of apparatuses substantially similar to the apparatus 12 and/or 66 and located at the same and/or different locations may be operably coupled to the server 14 via the network 16. In several exemplary embodiments, the computer readable medium of the server 14, and the contents stored therein, may be distributed throughout the system 10. In an exemplary embodiment, the computer readable medium of the server 14 and the contents stored therein may be distributed across a plurality of apparatuses such as, for example, the apparatus 12, the apparatus 66 and/or one or more other apparatuses substantially similar to the apparatus 12 and/or 66. In an exemplary embodiment, the server 14 may include one or more host computers, the computer 32 of the apparatus 12, and/or one or more computers in one or more other apparatuses that are substantially similar to the apparatus 12 and/or 66.

In an exemplary embodiment, the apparatus 12 and/or 66 may be characterized as a thick client. In an exemplary embodiment, the apparatus 12 and/or 66 may be characterized as a thin client, and therefore the functions and/or uses of the computer 32 including the processor 34 and/or the memory 36 may instead be functions and/or uses of the server 14. In several exemplary embodiments, the apparatus 12 and/or 66 may function as both a thin client and a thick client, with the degree to which the apparatus functions as a thin client and/or a thick client being dependent upon a variety of factors including, but not limited to, the instructions stored in the memory 36 for execution by the processor 34.

In an exemplary embodiment, as illustrated in FIG. 22 with continuing reference to FIGS. 1-21, an illustrative node 74 for implementing one or more embodiments of one or more of the above-described networks, elements, methods and/or steps, and/or any combination thereof, is depicted. The node 74 includes a microprocessor 74a, an input device 74b, a storage device 74c, a video controller 74d, a system memory 74e, a display 74f, and a communication device 74g all interconnected by one or more buses 74h. In several exemplary embodiments, the storage device 74c may include a floppy drive, hard drive, CD-ROM, optical drive, any other form of storage device and/or any combination thereof. In several exemplary embodiments, the storage device 74c may include, and/or be capable of receiving, a floppy disk, CD-ROM, DVD-ROM, or any other form of computer-readable medium that may contain executable instructions. In several exemplary embodiments, the communication device 74g may include a modem, network card, or any other device to enable the node to communicate with other nodes. In several exemplary embodiments, any node represents a plurality of interconnected (whether by intranet or Internet) computer systems, including without limitation, personal computers, mainframes, PDAs, and cell phones.

In several exemplary embodiments, one or more of the central server 14, the network 16, the remote user interfaces 18a and 18b, the control system 30, the computer 32, the control panel 42, the communication module 38, the sensors 40a, 40b, 40c and 40d, any other of the above-described sensors, and/or any of the above-described motors is, or at least includes, the node 74 and/or components thereof, and/or one or more nodes that are substantially similar to the node 74 and/or components thereof.

In several exemplary embodiments, a computer system typically includes at least hardware capable of executing machine readable instructions, as well as the software for executing acts (typically machine-readable instructions) that produce a desired result. In several exemplary embodiments, a computer system may include hybrids of hardware and software, as well as computer sub-systems.

In several exemplary embodiments, hardware generally includes at least processor-capable platforms, such as client-machines (also known as personal computers or servers), and hand-held processing devices (such as smart phones, personal digital assistants (PDAs), or personal computing devices (PCDs), for example). In several exemplary embodiments, hardware may include any physical device that is capable of storing machine-readable instructions, such as memory or other data storage devices. In several exemplary embodiments, other forms of hardware include hardware sub-systems, including transfer devices such as modems, modem cards, ports, and port cards, for example.

In several exemplary embodiments, software includes any machine code stored in any memory medium, such as RAM or ROM, and machine code stored on other devices (such as floppy disks, flash memory, or a CD ROM, for example). In several exemplary embodiments, software may include source or object code. In several exemplary embodiments, software encompasses any set of instructions capable of being executed on a node such as, for example, on a client machine or server.

In several exemplary embodiments, combinations of software and hardware could also be used for providing enhanced functionality and performance for certain embodiments of the present disclosure. In an exemplary embodiment, software functions may be directly manufactured into a silicon chip. Accordingly, it should be understood that combinations of hardware and software are also included within the definition of a computer system and are thus envisioned by the present disclosure as possible equivalent structures and equivalent methods.

In several exemplary embodiments, computer readable mediums include, for example, passive data storage, such as a random access memory (RAM) as well as semi-permanent data storage such as a compact disk read only memory (CD-ROM). One or more exemplary embodiments of the present disclosure may be embodied in the RAM of a computer to transform a standard computer into a new specific computing machine.

In several exemplary embodiments, data structures are defined organizations of data that may enable an embodiment of the present disclosure. In an exemplary embodiment, a data structure may provide an organization of data, or an organization of executable code. In several exemplary embodiments, data signals could be carried across transmission mediums and store and transport various data structures, and, thus, may be used to transport an embodiment of the present disclosure.

In several exemplary embodiments, the network 16, and/or one or more portions thereof, may be designed to work on any specific architecture. In an exemplary embodiment, one or more portions of the network 16 may be executed on a single computer, local area networks, client-server networks, wide area networks, internets, hand-held and other portable and wireless devices and networks.

In several exemplary embodiments, a database may be any standard or proprietary database software, such as Oracle, Microsoft Access, SyBase, or DBase II, for example. In several exemplary embodiments, the database may have fields, records, data, and other database elements that may be associated through database specific software. In several exemplary embodiments, data may be mapped. In several exemplary embodiments, mapping is the process of associating one data entry with another data entry. In an exemplary embodiment, the data contained in the location of a character file can be mapped to a field in a second table. In several exemplary embodiments, the physical location of the database is not limiting, and the database may be distributed. In an exemplary embodiment, the database may exist remotely from the server, and run on a separate platform. In an exemplary embodiment, the database may be accessible across the Internet. In several exemplary embodiments, more than one database may be implemented.

In several exemplary embodiments, while different steps, processes, and procedures are described as appearing as distinct acts, one or more of the steps, one or more of the processes, and/or one or more of the procedures could also be performed in different orders, simultaneously and/or sequentially. In several exemplary embodiments, the steps, processes and/or procedures could be merged into one or more steps, processes and/or procedures.

A system has been described that includes a hopper defining a first region in which ice is adapted to be disposed; a first door movable relative to the hopper, the first door comprising a closed position in which a second region is at least partially defined by the first door, and the first door substantially prevents the ice from entering the second region from the first region defined by the hopper; and an open position in which the ice is permitted to enter the second region from the first region; and a second door movable relative to each of the hopper and the first door, the second door comprising a closed position in which the second region is at least partially defined by the second door, and the second door substantially prevents the ice from exiting the second region after the ice has entered the second region from the first region defined by the hopper; and an open position in which the ice is permitted to exit the second region after the ice has entered the second region from the first region defined by the hopper. In an exemplary embodiment, the system further comprises a compartment, at least a portion of which at least partially defines the second region; wherein, when the first door is in its closed position and the second door is in its closed, position, the at least a portion of the compartment is disposed between the first and second doors, and the second region is at least partially defined by the at least a portion of the compartment, the first door and the second door. In an exemplary embodiment, the system further comprises a first actuator operably coupled to the first door and adapted to move the first door relative to each of the hopper and the second door. In an exemplary embodiment, a second actuator operably coupled to the second door and adapted to move the second door relative to each of the hopper and the first door. In an exemplary embodiment, the second door comprises opposing first and second ends; and at least one through-opening proximate the second end. In an exemplary embodiment, the system further comprises a drain pan positioned relative to the second door so that at least a portion of the drain pan is positioned below the at least one through-opening of the second door when the second door is in its closed position. In an exemplary embodiment, the second door comprises a generally V-shaped cross section; wherein the first door extends horizontally; and wherein the second door extends at angle so that the vertical position of the first end of the second door is higher than the vertical position of the second end of the second door. In an exemplary embodiment, the system further comprises a bagging mechanism comprising a bag into which the ice is adapted to enter in response to exiting the second region. In an exemplary embodiment, the system further comprises an agitating member extending within the first region defined by the hopper and adapted to agitate the ice. In an exemplary embodiment, the system further comprises an ice maker from which the hopper is adapted to receive the ice; a bagging mechanism comprising a bag into which the ice is adapted to enter in response to exiting the second region; a freezer adapted to store the bag after the ice has entered the bag; and a control system operably coupled to one or more of the ice maker, the hopper, the first door, the second door, the bagging mechanism and the freezer, the control system comprising a computer comprising a processor; and a memory accessible to the processor for storing instructions executable by the processor; a server in two-way communication with the control system via a network; and at least one remote user interface in two-way communication with the control system via the server and the network. In an exemplary embodiment, the control system further comprises one or more sensors operably coupled to the processor and adapted to monitor one or more of the ice maker, the hopper, the first door, the second door, the bagging mechanism, the bag and the freezer; and wherein the remote user interface permits one or more of the ice maker, the hopper, the first door, the second door, the bagging mechanism, the bag and the freezer to be remotely monitored and controlled.

A method has been described that includes providing a hopper defining a first region in which ice is disposed; measuring a first amount of the ice, permitting the first amount of the ice to exit the hopper and fall into a second region defined below at least a portion of the hopper; and disposing the first measured amount of the ice in a bag, comprising permitting the first measured amount of the ice to exit the second region and fall into the bag. In an exemplary embodiment, the method further comprises positioning a first door between the first and second regions so that the second region is generally isolated from the first region; wherein permitting the first amount of the ice to exit the hopper and fall into the second region comprises positioning a second door between the first door and the bag; and moving the first door relative to the hopper so that the second region is not generally isolated from the first region. In an exemplary embodiment, the second door generally prevents the first measured amount of the ice from exiting the second region after the first measured amount of the ice has fallen into the second region and before the first measured amount of the ice has fallen into the bag; and wherein permitting the first measured amount of the ice to exit the second region and fall into the bag comprises moving the second door relative to each of the hopper and the first door so that the second door does not prevent the first measured amount of the ice from exiting the second region. In an exemplary embodiment, disposing the first measured amount of the ice in the bag further comprises before permitting the first measured amount of the ice to exit the second region and fall into the bag, moving the first door relative to the hopper so that the first door is again positioned between the first and second regions and the second region is generally isolated from the first region. In an exemplary embodiment, the method further comprises moving the second door relative to each of the hopper and the first door so that the second door is again positioned between the second region and the bag. In an exemplary embodiment, the method further comprises if the bag is not filled with ice after disposing the first measured amount of the ice in the bag, then (a) measuring another amount of the ice disposed in the first region defined by the hopper, comprising permitting the another amount of the ice to exit the hopper and fall into the second region; (b) disposing the another measured amount of the ice in the bag, comprising permitting the another measured amount of the ice to exit the second region and fall into the bag; and (c) if the bag is not filled with ice after disposing the another measured amount of the ice in the bag, then repeating steps (a) and (b) until the bag is filled with ice. In an exemplary embodiment, the method further comprises determining whether there is a sufficient amount of ice in the first region defined by the hopper before measuring the another amount of the ice, comprising sensing the presence of the another amount of the ice in the first region defined by the hopper. In an exemplary embodiment, the method further comprises making the ice; filling the bag with ice, comprising disposing the first measured amount of the ice in the bag; and storing the bag in a freezer after filling the bag with ice. In an exemplary embodiment, the method further comprises remotely monitoring one or more of making the ice, measuring the first amount of the ice disposed in the first region defined by the hopper, filling the bag with ice, and storing the bag in the freezer. In an exemplary embodiment, the method further comprises remotely controlling one or more of making the ice, measuring the first amount of the ice disposed in the first region defined by the hopper, filling the bag with ice, and storing the bag in the freezer. In an exemplary embodiment, the method further comprises operably coupling a control system to at least one of the first and second doors, the control system comprising a computer comprising a processor; and a memory accessible to the processor for storing instructions executable by the processor; wherein remotely controlling one or more of making the ice, measuring the first amount of the ice disposed in the first region defined by the hopper, filling the bag with ice, and storing the bag in the freezer comprises downloading instructions from a remote location to the computer for storage in the memory; and executing the instructions stored in the memory using the processor; and wherein remotely monitoring one or more of making the ice, measuring the first amount of the ice disposed in the first region defined by the hopper, filling the bag with ice, and storing the bag in the freezer comprises transmitting to the computer one or more signals corresponding to one or more of making the ice, measuring the amount of the ice disposed in the first region defined by the hopper, filling the bag with ice, and storing the bag in the freezer; and transmitting information corresponding to the one or more signals to a remote location.

A system has been described that includes means for providing a hopper defining a first region in which ice is disposed; means for measuring a first amount of the ice, comprising means for permitting the first amount of the ice to exit the hopper and fall into a second region defined below at least a portion of the hopper; and means for disposing the first measured amount of the ice in a bag, comprising means for permitting the first measured amount of the ice to exit the second region and fall into the bag. In an exemplary embodiment, the system further comprises means for positioning a first door between the first and second regions so that the second region is generally isolated from the first region; wherein means for permitting the first amount of the ice to exit the hopper and fall into the second region comprises means for positioning a second door between the first door and the bag; and means for moving the first door relative to the hopper so that the second region is not generally isolated from the first region. In an exemplary embodiment, the second door generally prevents the first measured amount of the ice from exiting the second region after the first measured amount of the ice has fallen into the second region and before the first measured amount of the ice has fallen into the bag; and wherein means for permitting the first measured amount of the ice to exit the second region and fall into the bag comprises means for moving the second door relative to each of the hopper and the first door so that the second door does not prevent the first measured amount of the ice from exiting the second region. In an exemplary embodiment, means for disposing the first measured amount of the ice in the bag further comprises means for before permitting the first measured amount of the ice to exit the second region and fall into the bag, moving the first door relative to the hopper so that the first door is again positioned between the first and second regions and the second region is generally isolated from the first region. In an exemplary embodiment, the system further comprises means for moving the second door relative to each of the hopper and the first door so that the second door is again positioned between the second region and the bag. In an exemplary embodiment, the system further comprises means for if the bag is not filled with ice after disposing the first measured amount of the ice in the bag, then (a) measuring another amount of the ice disposed in the first region defined by the hopper, comprising permitting the another amount of the ice to exit the hopper and fall into the second region; (b) disposing the another measured amount of the ice in the bag, comprising permitting the another measured amount of the ice to exit the second region and fall into the bag; and (c) if the bag is not filled with ice after disposing the another measured amount of the ice in the bag, then repeating steps (a) and (b) until the bag is filled with ice. In an exemplary embodiment, the system further comprises means for determining whether there is a sufficient amount of ice in the first region defined by the hopper before measuring the another amount of the ice, comprising means for sensing the presence of the another amount of the ice in the first region defined by the hopper. In an exemplary embodiment, the system further comprises means for making the ice; means for filling the bag with ice, comprising means for disposing the first measured amount of the ice in the bag; and means for storing the bag in a freezer after filling the bag with ice. In an exemplary embodiment, the system further comprises means for remotely monitoring one or more of making the ice, measuring the first amount of the ice disposed in the first region defined by the hopper, filling the bag with ice, and storing the bag in the freezer. In an exemplary embodiment, the system further comprises means for remotely controlling one or more of making the ice, measuring the first amount of the ice disposed in the first region defined by the hopper, filling the bag with ice, and storing the bag in the freezer. In an exemplary embodiment, the system further comprises means for operably coupling a control system to at least one of the first and second doors, the control system comprising a computer comprising a processor; and a memory accessible to the processor for storing instructions executable by the processor; wherein means for remotely controlling one or more of making the ice, measuring the first amount of the ice disposed in the first region defined by the hopper, filling the bag with ice, and storing the bag in the freezer comprises means for downloading instructions from a remote location to the computer for storage in the memory; and means for executing the instructions stored in the memory using the processor; and wherein means for remotely monitoring one or more of making the ice, measuring the first amount of the ice disposed in the first region defined by the hopper, filling the bag with ice, and storing the bag in the freezer comprises means for transmitting to the computer one or more signals corresponding to one or more of making the ice, measuring the amount of the ice disposed in the first region defined by the hopper, filling the bag with ice, and storing the bag in the freezer; and means for transmitting information corresponding to the one or more signals to a remote location.

A computer readable medium has been described that includes a plurality of instructions stored therein, the plurality of instructions comprising instructions for measuring a first amount of ice disposed in a first region defined by a hopper, comprising instructions for permitting the first amount of the ice to exit the hopper and fall into a second region defined below at least a portion of the hopper; and instructions for disposing the first measured amount of the ice in a bag, comprising instructions for permitting the first measured amount of the ice to exit the second region and fall into the bag. In an exemplary embodiment, the plurality of instructions further comprises instructions for positioning a first door between the first and second regions so that the second region is generally isolated from the first region; wherein instructions for permitting the first amount of the ice to exit the hopper and fall into the second region comprise instructions for positioning a second door between the first door and the bag; and instructions for moving the first door relative to the hopper so that the second region is not generally isolated from the first region. In an exemplary embodiment, the second door generally prevents the first measured amount of the ice from exiting the second region after the first measured amount of the ice has fallen into the second region and before the first measured amount of the ice has fallen into the bag; and wherein instructions for permitting the first measured amount of the ice to exit the second region and fall into the bag comprise instructions for moving the second door relative to each of the hopper and the first door so that the second door does not prevent the first measured amount of the ice from exiting the second region. In an exemplary embodiment, instructions for disposing the first measured amount of the ice in the bag further comprise instructions for before permitting the first measured amount of the ice to exit the second region and fall into the bag, moving the first door relative to the hopper so that the first door is again positioned between the first and second regions and the second region is generally isolated from the first region. In an exemplary embodiment, the plurality of instructions further comprises instructions for moving the second door relative to each of the hopper and the first door so that the second door is again positioned between the second region and the bag. In an exemplary embodiment, the plurality of instructions further comprises instructions for if the bag is not filled with ice after disposing the first measured amount of the ice in the bag, then (a) measuring another amount of the ice disposed in the first region defined by the hopper, comprising permitting the another amount of the ice to exit the hopper and fall into the second region; (b) disposing the another measured amount of the ice in the bag, comprising permitting the another measured amount of the ice to exit the second region and fall into the bag; and (c) if the bag is not filled with ice after disposing the another measured amount of the ice in the bag, then repeating steps (a) and (b) until the bag is filled with ice. In an exemplary embodiment, the plurality of instructions further comprises instructions for determining whether there is a sufficient amount of ice in the first region defined by the hopper before measuring the another amount of the ice, comprising instructions for sensing the presence of the another amount of the ice in the first region defined by the hopper. In an exemplary embodiment, the plurality of instructions further comprises instructions for making the ice; instructions for filling the bag with ice, comprising instructions for disposing the first measured amount of the ice in the bag; and instructions for storing the bag in a freezer after filling the bag with ice. In an exemplary embodiment, the plurality of instructions further comprises instructions for remotely monitoring one or more of making the ice, measuring the first amount of the ice disposed in the first region defined by the hopper, filling the bag with ice, and storing the bag in the freezer. In an exemplary embodiment, the plurality of instructions further comprises instructions for remotely controlling one or more of making the ice, measuring the first amount of the ice disposed in the first region defined by the hopper, filling the bag with ice, and storing the bag in the freezer. In an exemplary embodiment, the plurality of instructions further comprises instructions for operably coupling a control system to at least one of the first and second doors, the control system comprising a computer comprising a processor; and a memory accessible to the processor for storing instructions executable by the processor; wherein instructions for remotely controlling one or more of making the ice, measuring the first amount of the ice disposed in the first region defined by the hopper, filling the bag with ice, and storing the bag in the freezer comprise instructions for downloading instructions from a remote location to the computer for storage in the memory; and instructions for executing the instructions stored in the memory using the processor; and wherein instructions for remotely monitoring one or more of making the ice, measuring the first amount of the ice disposed in the first region defined by the hopper, filling the bag with ice, and storing the bag in the freezer comprises instructions for transmitting to the computer one or more signals corresponding to one or more of making the ice, measuring the amount of the ice disposed in the first region defined by the hopper, filling the bag with ice, and storing the bag in the freezer; and instructions for transmitting information corresponding to the one or more signals to a remote location.

A system has been described that includes a hopper defining a first region in which ice is adapted to be disposed; a first door movable relative to the hopper, the first door comprising a closed position in which a second region is at least partially defined by the first door, and the first door substantially prevents the ice from entering the second region from the first region defined by the hopper; and an open position in which the ice is permitted to enter the second region from the first region; a second door movable relative to each of the hopper and the first door, the second door comprising opposing first and second ends, wherein the vertical position of the first end is higher than the vertical position of the second end; a closed position in which the second region is at least partially defined by the second door, and the second door substantially prevents the ice from exiting the second region after the ice has entered the second region from the first region defined by the hopper; and an open position in which the ice is permitted to exit the second region after the ice has entered the second region from the first region defined by the hopper; a compartment, at least a portion of which at least partially defines the second region; a first actuator operably coupled to the first door and adapted to move the first door relative to each of the hopper and the second door; a second actuator operably coupled to the second door and adapted to move the second door relative to each of the hopper and the first door; a drain pan positioned relative to the second door so that at least a portion of the drain pan is positioned below the at least one through-opening of the second door when the second door is in its closed position; an ice maker from which the hopper is adapted to receive the ice; a bagging mechanism comprising a bag into which the ice is adapted to enter in response to exiting the second region; a freezer adapted to store the bag after the ice has entered the bag; and a control system operably coupled to one or more of the ice maker, the hopper, the first door, the second door, the bagging mechanism and the freezer, the control system comprising a computer comprising a processor; and a memory accessible to the processor for storing instructions executable by the processor; and one or more sensors operably coupled to the processor and adapted to monitor one or more of the ice maker, the hopper, the first door, the second door, the bagging mechanism, the bag and the freezer; a server in two-way communication with the control system via a network; and at least one remote user interface in two-way communication with the control system via the server and the network, wherein the remote user interface permits one or more of the ice maker, the hopper, the first door, the second door, the bagging mechanism, the bag and the freezer to be remotely monitored and controlled; wherein, when the first door is in its closed position and the second door is in its closed, position, the at least a portion of the compartment is disposed between the first and second doors, and the second region is at least partially defined by the at least a portion of the compartment, the first door and the second door.

A method has been described that includes providing a hopper defining a first region in which ice is disposed; positioning a first door between the first region and a second region defined below at least a portion of the hopper so that the second region is generally isolated from the first region; measuring a first amount of the ice, comprising permitting the first amount of the ice to exit the hopper and fall into the second region, comprising positioning a second door between the first door and the bag; and moving the first door relative to the hopper so that the second region is not generally isolated from the first region, wherein the second door generally prevents the first measured amount of the ice from exiting the second region after the first measured amount of the ice has fallen into the second region; disposing the first measured amount of the ice in a bag, comprising permitting the first measured amount of the ice to exit the second region and fall into the bag, comprising moving the second door relative to each of the hopper and the first door so that the second door does not prevent the first measured amount of the ice from exiting the second region; and before permitting the first measured amount of the ice to exit the second region and fall into the bag, moving the first door relative to the hopper so that the first door is again positioned between the first and second regions and the second region is generally isolated from the first region; moving the second door relative to each of the hopper and the first door so that the second door is again positioned between the second region and the bag; if the bag is not filled with ice after disposing the first measured amount of the ice in the bag, then (a) measuring another amount of the ice disposed in the first region defined by the hopper, comprising permitting the another amount of the ice to exit the hopper and fall into the second region; (b) determining whether there is a sufficient amount of ice in the first region defined by the hopper before measuring the another amount of the ice, comprising sensing the presence of the another amount of the ice in the first region defined by the hopper; (c) disposing the another measured amount of the ice in the bag, comprising permitting the another measured amount of the ice to exit the second region and fall into the bag; and (d) if the bag is not filled with ice after disposing the another measured amount of the ice in the bag, then repeating steps (a) through (c) until the bag is filled with ice; making the ice; filling the bag with ice, comprising disposing the first measured amount of the ice in the bag; storing the bag in a freezer after filling the bag with ice; operably coupling a control system to at least one of the first and second doors, the control system comprising a computer comprising a processor; and a memory accessible to the processor for storing instructions executable by the processor; remotely controlling one or more of making the ice, measuring the first amount of the ice disposed in the first region defined by the hopper, filling the bag with ice, and storing the bag in the freezer, comprising downloading instructions from a remote location to the computer for storage in the memory; and executing the instructions stored in the memory using the processor; and remotely monitoring one or more of making the ice, measuring the first amount of the ice disposed in the first region defined by the hopper, filling the bag with ice, and storing the bag in the freezer, comprising transmitting to the computer one or more signals corresponding to one or more of making the ice, measuring the amount of the ice disposed in the first region defined by the hopper, filling the bag with ice, and storing the bag in the freezer; and transmitting information corresponding to the one or more signals to a remote location.

A system has been described that includes means for providing a hopper defining a first region in which ice is disposed; means for positioning a first door between the first region and a second region defined below at least a portion of the hopper so that the second region is generally isolated from the first region; means for measuring a first amount of the ice, comprising means for permitting the first amount of the ice to exit the hopper and fall into the second region, comprising means for positioning a second door between the first door and the bag; and means for moving the first door relative to the hopper so that the second region is not generally isolated from the first region, wherein the second door generally prevents the first measured amount of the ice from exiting the second region after the first measured amount of the ice has fallen into the second region; means for disposing the first measured amount of the ice in a bag, comprising means for permitting the first measured amount of the ice to exit the second region and fall into the bag, comprising means for moving the second door relative to each of the hopper and the first door so that the second door does not prevent the first measured amount of the ice from exiting the second region; and means for before permitting the first measured amount of the ice to exit the second region and fall into the bag, moving the first door relative to the hopper so that the first door is again positioned between the first and second regions and the second region is generally isolated from the first region; means for moving the second door relative to each of the hopper and the first door so that the second door is again positioned between the second region and the bag; means for if the bag is not filled with ice after disposing the first measured amount of the ice in the bag, then (a) measuring another amount of the ice disposed in the first region defined by the hopper, comprising permitting the another amount of the ice to exit the hopper and fall into the second region; (b) determining whether there is a sufficient amount of ice in the first region defined by the hopper before measuring the another amount of the ice, comprising sensing the presence of the another amount of the ice in the first region defined by the hopper; (c) disposing the another measured amount of the ice in the bag, comprising permitting the another measured amount of the ice to exit the second region and fall into the bag; and (d) if the bag is not filled with ice after disposing the another measured amount of the ice in the bag, then repeating steps (a) through (c) until the bag is filled with ice; means for making the ice; means for filling the bag with ice, comprising means for disposing the first measured amount of the ice in the bag; means for storing the bag in a freezer after filling the bag with ice; means for operably coupling a control system to at least one of the first and second doors, the control system comprising a computer comprising a processor; and a memory accessible to the processor for storing instructions executable by the processor; means for remotely controlling one or more of making the ice, measuring the first amount of the ice disposed in the first region defined by the hopper, filling the bag with ice, and storing the bag in the freezer, comprising means for downloading instructions from a remote location to the computer for storage in the memory; and means for executing the instructions stored in the memory using the processor; and means for remotely monitoring one or more of making the ice, measuring the first amount of the ice disposed in the first region defined by the hopper, filling the bag with ice, and storing the bag in the freezer, comprising means for transmitting to the computer one or more signals corresponding to one or more of making the ice, measuring the amount of the ice disposed in the first region defined by the hopper, filling the bag with ice, and storing the bag in the freezer; and means for transmitting information corresponding to the one or more signals to a remote location.

A computer readable medium has been described that includes a plurality of instructions stored therein, the plurality of instructions comprising instructions for positioning a first door between a first region defined by a hopper in which ice is disposed and a second region defined below at least a portion of the hopper so that the second region is generally isolated from the first region; instructions for measuring a first amount of the ice, comprising instructions for permitting the first amount of the ice to exit the hopper and fall into the second region, comprising instructions for positioning a second door between the first door and the bag; and instructions for moving the first door relative to the hopper so that the second region is not generally isolated from the first region, wherein the second door generally prevents the first measured amount of the ice from exiting the second region after the first measured amount of the ice has fallen into the second region; instructions for disposing the first measured amount of the ice in a bag, comprising instructions for permitting the first measured amount of the ice to exit the second region and fall into the bag, comprising instructions for moving the second door relative to each of the hopper and the first door so that the second door does not prevent the first measured amount of the ice from exiting the second region; and instructions for before permitting the first measured amount of the ice to exit the second region and fall into the bag, moving the first door relative to the hopper so that the first door is again positioned between the first and second regions and the second region is generally isolated from the first region; instructions for moving the second door relative to each of the hopper and the first door so that the second door is again positioned between the second region and the bag; instructions for if the bag is not filled with ice after disposing the first measured amount of the ice in the bag, then (a) measuring another amount of the ice disposed in the first region defined by the hopper, comprising permitting the another amount of the ice to exit the hopper and fall into the second region; (b) determining whether there is a sufficient amount of ice in the first region defined by the hopper before measuring the another amount of the ice, comprising sensing the presence of the another amount of the ice in the first region defined by the hopper; (c) disposing the another measured amount of the ice in the bag, comprising permitting the another measured amount of the ice to exit the second region and fall into the bag; and (d) if the bag is not filled with ice after disposing the another measured amount of the ice in the bag, then repeating steps (a) through (c) until the bag is filled with ice; instructions for making the ice; instructions for filling the bag with ice, comprising instructions for disposing the first measured amount of the ice in the bag; instructions for storing the bag in a freezer after filling the bag with ice; instructions for operably coupling a control system to at least one of the first and second doors, the control system comprising a computer comprising a processor; and a memory accessible to the processor for storing instructions executable by the processor; instructions for remotely controlling one or more of making the ice, measuring the first amount of the ice disposed in the first region defined by the hopper, filling the bag with ice, and storing the bag in the freezer, comprising instructions for downloading instructions from a remote location to the computer for storage in the memory; and instructions for executing the instructions stored in the memory using the processor; and instructions for remotely monitoring one or more of making the ice, measuring the first amount of the ice disposed in the first region defined by the hopper, filling the bag with ice, and storing the bag in the freezer, comprising instructions for transmitting to the computer one or more signals corresponding to one or more of making the ice, measuring the amount of the ice disposed in the first region defined by the hopper, filling the bag with ice, and storing the bag in the freezer; and instructions for transmitting information corresponding to the one or more signals to a remote location.

It is understood that variations may be made in the foregoing without departing from the scope of the disclosure. Furthermore, the elements and teachings of the various illustrative exemplary embodiments may be combined in whole or in part in some or all of the illustrative exemplary embodiments. In addition, one or more of the elements and teachings of the various illustrative exemplary embodiments may be omitted, at least in part, and/or combined, at least in part, with one or more of the other elements and teachings of the various illustrative embodiments.

Any spatial references such as, for example, "upper," "lower," "above," "below," "between," "vertical," "horizontal," "angular," "upwards," "downwards," "side-to-side," "left-to-right," "right-to-left," "top-to-bottom," "bottom-to-top," "top," "bottom," "bottom-up," "top-down," etc., are for the purpose of illustration only and do not limit the specific orientation or location of the structure described above.

In several exemplary embodiments, one or more of the operational steps in each embodiment may be omitted. Moreover, in some instances, some features of the present disclosure may be employed without a corresponding use of the other features. Moreover, one or more of the above-described embodiments and/or variations may be combined in whole or in part with any one or more of the other above-described embodiments and/or variations.

Although several exemplary embodiments have been described in detail above, the embodiments described are exemplary only and are not limiting, and those skilled in the art will readily appreciate that many other modifications, changes and/or substitutions are possible in the exemplary embodiments without materially departing from the novel teachings and advantages of the present disclosure. Accordingly, all such modifications, changes and/or substitutions are intended to be included within the scope of this disclosure as defined in the following claims. In the claims, means-plus-function clauses are intended to cover the structures described herein as performing the recited function and not only structural equivalents, but also equivalent structures.

What is claimed is:

1. A system comprising:
a hopper defining a first region in which ice is adapted to be disposed;
a first door movable relative to the hopper, the first door comprising:
a closed position in which:
a second region is at least partially defined by the first door, and
the first door substantially prevents the ice from entering the second region from the first region defined by the hopper; and
an open position in which the ice is permitted to enter the second region from the first region;
a second door movable relative to each of the hopper and the first door, the second door comprising:
a closed position in which:
the second region is at least partially defined by the second door, and
the second door substantially prevents the ice from exiting the second region after the ice has entered the second region from the first region defined by the hopper;
an open position in which the ice is permitted to exit the second region after the ice has entered the second region from the first region defined by the hopper;
opposing first and second ends; and
at least one through-opening proximate the second end; and
a drain pan positioned relative to the second door so that at least a portion of the drain pan is positioned below the at least one through-opening of the second door when the second door is in its closed position;
wherein the second door comprises a generally V-shaped cross section;
wherein the first door extends horizontally; and
wherein the second door extends at angle so that the vertical position of the first end of the second door is higher than the vertical position of the second end of the second door.

2. The system of claim 1 further comprising:
a compartment, at least a portion of which at least partially defines the second region;
wherein, when the first door is in its closed position and the second door is in its
closed position,
the at least a portion of the compartment is disposed between the first and second doors, and
the second region is at least partially defined by the at least a portion of the compartment, the first door and the second door.

3. The system of claim 1 further comprising:
a first actuator operably coupled to the first door and adapted to move the first door relative to each of the hopper and the second door.

4. The system of claim 3 further comprising:
a second actuator operably coupled to the second door and adapted to move the second door relative to each of the hopper and the first door.

5. The system of claim 1 further comprising:
a bagging mechanism comprising a bag into which the ice is adapted to enter in response to exiting the second region.

6. The system of claim 1 further comprising:
an agitating member extending within the first region defined by the hopper and adapted to agitate the ice.

7. The system of claim 1 further comprising:
an ice maker from which the hopper is adapted to receive the ice;
a bagging mechanism comprising a bag into which the ice is adapted to enter in response to exiting the second region; and
a freezer adapted to store the bag after the ice has entered the bag.

8. The system of claim 7 further comprising:
a control system operably coupled to one or more of the ice maker, the hopper, the first door, the second door, the bagging mechanism and the freezer, the control system comprising:
a computer comprising:
a processor; and
a memory accessible to the processor for storing instructions executable by the processor;
and
one or more sensors operably coupled to the processor and adapted to monitor one or more of the ice maker, the hopper, the first door, the second door, the bagging mechanism, the bag and the freezer.

9. A system comprising:
a hopper defining a first region in which ice is adapted to be disposed;
a first door movable relative to the hopper, the first door comprising:
a closed position in which:
a second region is at least partially defined by the first door, and
the first door substantially prevents the ice from entering the second region from the first region defined by the hopper; and
an open position in which the ice is permitted to enter the second region from the first region;
a second door movable relative to each of the hopper and the first door, the second door comprising:
a closed position in which:
the second region is at least partially defined by the second door, and
the second door substantially prevents the ice from exiting the second region after the ice has entered the second region from the first region defined by the hopper; and
an open position in which the ice is permitted to exit the second region after the ice has entered the second region from the first region defined by the hopper;
an ice maker from which the hopper is adapted to receive the ice;
a bagging mechanism comprising a bag into which the ice is adapted to enter in response to exiting the second region;
a freezer adapted to store the bag after the ice has entered the bag; and
a control system operably coupled to one or more of the ice maker, the hopper, the first door, the second door, the bagging mechanism and the freezer, the control system comprising a computer comprising:
a processor; and
a memory accessible to the processor for storing instructions executable by the processor;
a server in two-way communication with the control system via a network; and
at least one remote user interface in two-way communication with the control system via the server and the network.

10. The system of claim 9 wherein the control system further comprises one or more sensors operably coupled to the processor and adapted to monitor one or more of the ice maker, the hopper, the first door, the second door, the bagging mechanism, the bag and the freezer; and
wherein the remote user interface permits one or more of the ice maker, the hopper, the first door, the second door, the bagging mechanism, the bag and the freezer to be remotely monitored and controlled.

11. The system of claim 9 further comprising:
a compartment, at least a portion of which at least partially defines the second region;
wherein, when the first door is in its closed position and the second door is in its closed position,
the at least a portion of the compartment is disposed between the first and second doors, and
the second region is at least partially defined by the at least a portion of the compartment, the first door and the second door.

12. The system of claim 9 further comprising:
a first actuator operably coupled to the first door and adapted to move the first door relative to each of the hopper and the second door.

13. The system of claim 12 further comprising:
a second actuator operably coupled to the second door and adapted to move the second door relative to each of the hopper and the first door.

14. The system of claim 9 wherein the second door comprises:
opposing first and second ends; and
at least one through-opening proximate the second end.

15. The system of claim 14 further comprising:
a drain pan positioned relative to the second door so that at least a portion of the drain pan is positioned below the at least one through-opening of the second door when the second door is in its closed position.

16. The system of claim 15 wherein the second door comprises a generally V-shaped cross section;
wherein the first door extends horizontally; and
wherein the second door extends at angle so that the vertical position of the first end of the second door is higher than the vertical position of the second end of the second door.

17. The system of claim 9 further comprising:
an agitating member extending within the first region defined by the hopper and adapted to agitate the ice.

18. A system comprising:
a hopper defining a first region in which ice is adapted to be disposed;
a first door movable relative to the hopper, the first door comprising:
a closed position in which:
a second region is at least partially defined by the first door, and
the first door substantially prevents the ice from entering the second region from the first region defined by the hopper;

and
an open position in which the ice is permitted to enter the second region from the first region;
a second door movable relative to each of the hopper and the first door, the second door comprising:
opposing first and second ends, wherein the vertical position of the first end is higher than the vertical position of the second end;
at least one through-opening proximate the second end;
a closed position in which:
the second region is at least partially defined by the second door, and
the second door substantially prevents the ice from exiting the second region after the ice has entered the second region from the first region defined by the hopper;
and
an open position in which the ice is permitted to exit the second region after the ice has entered the second region from the first region defined by the hopper;
a compartment, at least a portion of which at least partially defines the second region;
a first actuator operably coupled to the first door and adapted to move the first door relative to each of the hopper and the second door;
a second actuator operably coupled to the second door and adapted to move the second door relative to each of the hopper and the first door;
a drain pan positioned relative to the second door so that at least a portion of the drain pan is positioned below the at least one through-opening of the second door when the second door is in its closed position;
an ice maker from which the hopper is adapted to receive the ice;
a bagging mechanism comprising a bag into which the ice is adapted to enter in response to exiting the second region;
a freezer adapted to store the bag after the ice has entered the bag; and
a control system operably coupled to one or more of the ice maker, the hopper, the first door, the second door, the bagging mechanism and the freezer, the control system comprising:
a computer comprising:
a processor; and
a memory accessible to the processor for storing instructions executable by the processor;
and
one or more sensors operably coupled to the processor and adapted to monitor one or more of the ice maker, the hopper, the first door, the second door, the bagging mechanism, the bag and the freezer;
a server in two-way communication with the control system via a network;
and
at least one remote user interface in two-way communication with the control system via the server and the network, wherein the remote user interface permits one or more of the ice maker, the hopper, the first door, the second door, the bagging mechanism, the bag and the freezer to be remotely monitored and controlled;
wherein, when the first door is in its closed position and the second door is in its Closed position,
the at least a portion of the compartment is disposed between the first and second doors, and
the second region is at least partially defined by the at least a portion of the compartment, the first door and the second door.

* * * * *